US007652098B2

United States Patent
Yamaguchi et al.

(10) Patent No.: US 7,652,098 B2
(45) Date of Patent: Jan. 26, 2010

(54) RESIN COMPOSITION FOR GHZ-BAND ELECTRONIC COMPONENT AND GHZ-BAND ELECTRONIC COMPONENT

(75) Inventors: Kouichi Yamaguchi, Kyoto (JP); Hidekazu Hayama, Kyoto (JP); Ren-De Sun, Kyoto (JP); Masahiro Yamada, Osaka (JP); Hitoshi Nishino, Osaka (JP); Yasunori Yokomichi, Osaka (JP)

(73) Assignee: Osaka Gas Co., Ltd, Osaka-Shi (JP)

( * ) Notice: Subject to any disclaimer, the term of this patent is extended or adjusted under 35 U.S.C. 154(b) by 282 days.

(21) Appl. No.: 10/587,950

(22) PCT Filed: Feb. 2, 2005

(86) PCT No.: PCT/JP2005/001868

§ 371 (c)(1),
(2), (4) Date: Aug. 2, 2006

(87) PCT Pub. No.: WO2005/075571

PCT Pub. Date: Aug. 18, 2005

(65) Prior Publication Data

US 2007/0129481 A1    Jun. 7, 2007

(30) Foreign Application Priority Data

Feb. 4, 2004    (JP) ............................. 2004-027996
Dec. 27, 2004   (JP) ............................. 2004-376806

(51) Int. Cl.
*C08K 3/04*    (2006.01)

(52) U.S. Cl. ...................... 524/496; 524/495; 252/502; 252/503; 252/504

(58) Field of Classification Search ................. 524/496
See application file for complete search history.

(56) References Cited

U.S. PATENT DOCUMENTS 6,960,334 B1 *   11/2005  Matsui et al. ............ 423/447.1
2003/0008123 A1 *  1/2003  Glatkowski et al. ...... 428/294.4

(Continued)

FOREIGN PATENT DOCUMENTS

CN    1410475 A    4/2003

(Continued)

OTHER PUBLICATIONS

S.B. Legoas, et al.; "Molecular-Dynamics Simulations of Carbon Nanotubes as Gigahertz Oscillators;" *Physical Review Letters*; vol. 90; No. 5; Feb. 7, 2003; pp. 055504-1-055504-4 and cover sheet (5 sheets total).

(Continued)

*Primary Examiner*—David Wu
*Assistant Examiner*—Vu Nguyen
(74) *Attorney, Agent, or Firm*—Kratz, Quintos & Hanson, LLP

(57) ABSTRACT

The present invention relates to a resin composition for GHz-band electronic components, the composition comprising nanoscale carbon tubes and at least one member selected from the group consisting of thermoplastic resins, curable resins, and composite resins of thermoplastic resins and curable resins; wherein the nanoscale carbon tubes are present in an amount of 0.0001 to 0.4 wt. % based on the resin; and an electronic component obtainable from the resin composition, or the like.

14 Claims, 10 Drawing Sheets

U.S. PATENT DOCUMENTS

2003/0175462 A1  9/2003  Nishino et al.

FOREIGN PATENT DOCUMENTS

| | | |
|---|---|---|
| EP | 1 146 013 A1 | 10/2001 |
| JP | 8-134263 | 5/1996 |
| JP | 10-223048 | 8/1998 |
| JP | 2002-290094 | 10/2002 |
| JP | 3355442 | 10/2002 |
| JP | 2002-338220 | 11/2002 |
| JP | 2003-158395 | 5/2003 |
| WO | WO 02/100931 A1 | 12/2002 |

OTHER PUBLICATIONS

Haralampos Zois, et al., "Dielectric Properties and Morphology of Polymer Composites Filled with Dispersed Iron", *Journal of Applied Polymer Science*, vol. 88, pp. 3013-3020 (2003).

\* cited by examiner

25nm (a-1)  (a-2)

RESIN COMPOSITION FOR GHZ-BAND ELECTRONIC COMPONENT AND GHZ-BAND ELECTRONIC COMPONENT

TECHNICAL FIELD

The present invention relates to a resin composition for GHz-band electronic components. More specifically, the present invention relates to a resin composition that has a low dielectric loss tangent and is suitable for producing circuit board materials for electrical and electronic devices, in particular circuit board materials and other electronic components for GHz band. The present invention also relates to electronic components obtained from such a resin composition.

BACKGROUND ART

With the recent rapid increase in the amount of information communicated, reductions in size and weight and increases in the speed of information communication devices, such as PHS and cellular phones, are strongly demanded, and electrical insulating materials with low dielectric constants that can cope with such demands are required. In particular, portable mobile communications such as automobile phones and digital cellular phones, mobile communication devices such as satellite communications, and like devices use radio waves at high frequencies in the MHz to GHz bands. Further, due to the decrease of usable wavelength bands, high-frequency bands such as microwave and milliwave bands are increasingly used. Furthermore, the CPU clock time of computers has reached a GHz band, and higher and higher frequencies are used. To reduce the size and weight of communication devices operating at such high-frequency bands, it is necessary to develop an electric insulating material that has both excellent RF transmission characteristics and low dielectric properties.

In many cases, circuit board materials of electronic devices are required to have low dielectric properties, such as a low dielectric constant, a low dielectric loss tangent, etc., and excellent physical properties, such as high heat resistance, high mechanical strength, etc. The dielectric constant ($\in$) is a parameter indicating the degree of polarization in a dielectric, and the higher the dielectric constant, the greater the propagation delay of electrical signals. Therefore, to increase the propagation velocity of signals and enable high-speed operation, a low dielectric constant is preferable. The dielectric loss tangent (tan $\delta$) is a parameter indicating the amount of a signal lost by conversion to heat during propagation through a dielectric, and the lower the dielectric loss tangent, the smaller the signal loss and the higher the signal transmission rate.

That is, energy loss in a transmission process, which is called dielectric loss, is caused in electronic circuits, and is not preferable since the lost energy is released in the electronic circuits as thermal energy. In low-frequency bands, such energy loss is caused because dipoles generated by dielectric polarization oscillate due to the change of the electric field, and in high-frequency bands, it is caused by ionic polarization or electronic polarization. The ratio of the energy consumed in a dielectric per cycle of an alternating electric field to the energy stored in the dielectric is called a dielectric loss tangent and expressed as tan $\delta$.

In high-frequency bands, tan $\delta$ increases with an increase in frequency, and high-density packaging of electronic devices increases the amount of heat generated per unit area. Therefore, a material with a low tan $\delta$ needs to be used to achieve low dielectric loss in an insulating material. The use of a low-dielectric polymeric material with low dielectric loss suppresses heat generation by dielectric loss and electrical resistance, thereby reducing signal malfunctions. Thus, there are strong demands for materials with low transmission loss (energy loss) in the field of high-frequency communications.

Materials having electrical properties such as electrical insulation, low dielectric constant, etc., include polyolefines, vinyl chloride resins, fluororesins, and like thermoplastic resins; unsaturated polyester resins, polyimide resins, epoxy resins, bismaleimide triazine resins (BT resins), crosslinkable polyphenylene oxides, curable polyphenylene ethers, and like thermosetting resins; etc. Various types of such resins have been developed to satisfy the following properties:

- drilling processability and cutting processability of laminated plates;
- high heat resistance;
- low coefficient of linear expansion;
- adhesion or bonding to metal conductor layers (copper foil adhesion);
- mechanical strength;
- thin-film-forming ability;
- a dielectric constant that can be selected as desired from a relatively wide range;
- insulating properties;
- weather resistance; and
- low dependency of dielectric properties on temperature and humidity.

However, resins as mentioned above have the following problems.

(1) Polyolefins

Polyolefins, such as polyethylenes and polypropylenes, have the drawback of low heat resistance, although they have excellent electrical properties such as high insulation resistance, since they have C—C bonds or like covalent bonds and contain no highly polar groups. Therefore, they exhibit impaired electrical properties (dielectric loss, dielectric constant, etc.) at high temperatures, and thus are not suitable for insulating films (layers) for capacitors and the like.

Polyethylenes and polypropylenes are made into films and then bonded over electrically conductive materials with adhesives. Such a process not only involves complicated steps but also has problems in film formation, such as extreme difficulties in forming thin films.

(2) Vinyl Chloride Resins

Vinyl chloride resins have low heat resistance like polyolefins, and have high dielectric loss, although they exhibit high insulation resistance, excellent chemical resistance and excellent flame retardancy.

(3) Polyvinylidene Fluorides, Trifluoroethylene Resins and Perfluoroethylene Resins Although these polymers, which contain fluorine atoms in their molecular chains, have excellent electrical properties (low dielectric constant and low dielectric loss), high heat resistance and high chemical stability, they have drawbacks in molding processability and film-forming ability, such that they need to be heat-treated, like thermoplastic resins, to obtain molded articles, films, etc. Thus, considerably high cost is required to fabricate devices from such resins. Further, since they have low transparency, they have the additional disadvantage of offering limited applications.

(4) Epoxy Resins

Epoxy resins satisfy the requirements for insulation resistance, dielectric breakdown strength and heat resistance, but they have a relatively high dielectric constant of not less than 3, failing to satisfy the property requirements, and also have the drawback of poor thin-film-forming ability. A curable modified PPO resin composition is known, which is obtained by mixing a polyphenylene oxide (PPO) resin, polyfunctional cyanate resin and other resins, followed by the addition of a radical polymerization initiator and a preliminary reaction. However, the resin composition does not have a satisfactorily low dielectric constant. Further, to improve the poor heat resistance of epoxy resins, the combined use of epoxy resins with, for example, phenol novolac resins, vinyl triazine resins, etc., is being studied, but such combined use is disadvantageous in that the resulting film has extremely poor mechanical properties. To solve the above problems, i.e., to improve heat-processability, and adhesion and bonding to metal conductors (layers) such as copper, while maintaining electrical properties, branched cyclic amorphous fluoropolymers, copolymers of perfluoroethylene monomers and other monomers, etc., have been proposed. Such polymers and copolymers have satisfactory electrical properties such as dielectric constant and dielectric loss, but they have poor heat resistance due to methylene chains present in their polymer chains, and do not satisfactorily adhere to device substrates and the like.

(5) Polyimides, Polyethersulfones, Polyphenylene Sulfides, Polysulfones, Thermosetting Polyphenylene Ethers (PPEs), Polyethylene Terephthalates Since device fabrication processes always include a soldering step, low-dielectric-constant materials with excellent dielectric properties and insulation resistance are further required to have sufficient heat resistance to withstand heating at least at 260° C. for 120 seconds, excellent chemical stability such as high alkali resistance and the like, moisture resistance and mechanical properties. Polymeric materials satisfying these requirements are known and include polyimides, polyethersulfones, polyphenylene sulfides, polysulfones, thermosetting polyphenylene ethers (PPEs), polyethylene terephthalate, etc. However, even these resins have high dielectric loss in the GHz band.

Thus, various difficulties are encountered in achieving the above properties by using only resins, and therefore the addition of additives to resins has been proposed for improving the electrical properties of resins. For example, Japanese Unexamined Patent Publication No. 1996-134263 discloses that addition of a certain amount of a specific metal silicate-based fibrous material to a synthetic resin improves the thermal conductivity, heat resistance and mechanical strength without increasing the dielectric constant and dielectric loss tangent to such an extent as to hinder the use in high frequency ranges, and in some types of resins, remarkably decreases the dielectric loss tangent while maintaining the same degree of dielectric constant, and thus resins containing such fibrous material can be used extremely advantageously as circuit board materials, and in particular circuit board materials for high-frequency applications, which are different from the conventional electrical applications of electrical and electronic components to which resins are applied.

More specifically, Japanese Unexamined Patent Publication No. 1996-134263 proposes a resin composition for high-frequency electronic components obtained by adding, to a thermoplastic resin (excluding polyamide resins) and/or a thermosetting resin (excluding phenol resins), reinforcing fibers comprising as a main ingredient a metal silicate-based fibrous material represented by the formula $aM_x.O_y.bSiO_2.ocH_2O$ (wherein a, b and c are each a positive real number; when x is 1, y is 1; when x is 2, y is 1 or 3; and M is at least one metal element selected from the group consisting of Mg, Cr, Mn, Fe, Co, Ni, Cu, Zn, Al, Ga, Sr, Y, Zr, Nb, Mo, Pb, Ba, W and Li), the amount of the reinforcing fibers being 5 to 60 wt. % based on the total weight of the resin and fibrous material.

In Japanese Unexamined Patent Publication 1996-134263, the reinforcing fiber is added to a thermoplastic resin or thermosetting resin in an amount of at least about 5 wt. %, indicating that the reinforcing fiber needs to be used in a large amount.

DISCLOSURE OF THE INVENTION

The main object of the present invention is to develop an additive that, even when added in a small amount, can reduce dielectric loss (or tan δ) in the GHz band, thereby providing a resin composition for electronic components that flexibly meet various demands.

Another object of the present invention is to provide a resin composition that is extremely advantageous for producing circuit board materials for electrical and electronic devices, in particular circuit board materials for the GHz band, and other electronic components, the resin composition having a low dielectric constant, a low dielectric loss tangent, high heat resistance and high mechanical strength.

The present inventors conducted extensive research to achieve the above object, and found that the addition of nanoscale carbon tubes in a small amount within a specific range to a synthetic resin suppresses an increase of the dielectric loss tangent in high-frequency bands, and in particular in the GHz band, and allows the synthetic resin to retain its properties, such as thermal conductivity, heat resistance, mechanical strength, dielectric constant, etc., a resin composition containing a specific small amount of nanoscale carbon tubes can be used extremely advantageously as a circuit board material, and in particular a circuit board material for the GHz band.

When nanoscale carbon tubes, which are inherently electrically conductive, are added to a resin composition in an amount of 5 wt. % or more, as in Japanese Unexamined Patent Publication 1996-134263, electronic components molded from the resulting resin composition are also conductive. Therefore, nanoscale carbon tubes cannot be added to a resin for high-frequency electronic components in a large amount as mentioned in Japanese Unexamined Patent Publication No. 1996-134263, and no attempt has been heretofore made to reduce the dielectric loss tangent in high-frequency bands using nanoscale carbon tubes. However, the present inventors' research unexpectedly revealed that when carbon nanotubes are added to a resin composition in a minute amount that is much smaller than the 5 wt. % mentioned in Japanese Unexamined Patent Publication No. 1996-134263, the dielectric loss tangent in the GHz band is reduced or its increase is suppressed.

The present invention was achieved by further research based on the above findings, and provides the following electronic component resin composition, electronic components, etc.

Item 1. A resin composition for GHz-band electronic components, the composition comprising nanoscale carbon tubes and at least one resin selected from the group consisting of thermoplastic resins, curable resins, and composite resins of thermoplastic resins and curable resins, wherein the amount of the nanoscale carbon tubes is 0.0001 to 0.4 wt. % based on the resin.

Item 2. A resin composition for GHz-band electronic components according to item 1, wherein the nanoscale carbon tubes are:
(i) single-walled carbon nanotubes or nested multi-walled carbon nanotubes;
(ii) amorphous nanoscale carbon tubes;
(iii) nanoflake carbon tubes;
(iv) iron-carbon composites each composed of (a) a carbon tube selected from the group consisting of nanoflake carbon tubes and nested multi-walled carbon nanotubes, and (b) iron carbide or iron, wherein the iron carbide or iron (b) fills 10 to 90% of the internal space of the carbon tube (a); or (v) a mixture of at least two of (i) to (iv).

Item 3. A resin composition for GHz-band electronic components according to item 1 or 2, wherein the nanoscale carbon tubes are amorphous nanoscale carbon tubes having an interlayer spacing between hexagonal carbon layers (002) of not less than 3.54 Å, an angle of diffraction ($2\theta$) of not more than 25.1 degrees, and a $2\theta$ band half-width of not less than 3.2 degrees, as determined by X-ray diffractometry (incident X-ray: CuK$\alpha$).

Item 4. A resin composition for GHz-band electronic components according to any one of items 1 to 3, wherein the resin is at least one thermoplastic resin selected from the group consisting of polyolefin resins, polyester resins, polyamide resins, fluororesins, polystyrene resins, polyvinyl chloride resins, methacrylic ester resins, acrylic ester resins, polycarbonate resins, polysulfone resins, polyethersulfone resins, polyphenylene sulfide resins, polyphenylene ether resins, ABS resins, polyetheretherketone resins, liquid crystal polymers, thermoplastic polyimide resins, polyetherimide resins, polyacetals, polyarylates and polyethernitrile resins.

Item 5. A resin composition for GHz-band electronic components according to any one of items 1 to 3, wherein the resin is at least one curable resin selected from the group consisting of thermosetting resins, photocurable resins and electron-beam-curable resins.

Item 6. A resin composition for GHz-band electronic components according to item 1, wherein the resin is at least one composite resin selected from the group consisting thermoplastic resins having dispersed therein cured product of curable resin and curable resins having dispersed therein a thermoplastic resin.

Item 7. A resin composition for GHz-band electronic components according to any one of items 1 to 6, wherein the amount of the nanoscale carbon tubes is 0.001 to 0.4 wt. % based on the resin.

Item 8. A resin composition for GHz-band electronic components according to any one of items 1 to 6, wherein the nanoscale carbon tubes are single-walled carbon nanotubes or nested multi-walled carbon nanotubes, and wherein the amount of the nanoscale carbon tubes is 0.0001 to 0.1 wt. % based on the resin.

Item 9. A resin composition for GHz-band electronic components according to any one of items 1 to 6, wherein the nanoscale carbon tubes are amorphous nanoscale carbon tubes, and wherein the amount of the nanoscale carbon tubes is 0.0001 to 0.1 wt. % based on the resin.

Item 10. A resin composition for GHz-band electronic components according to any one of items 1 to 6, wherein the nanoscale carbon tubes are iron-carbon composites, and wherein the amount of the nanoscale carbon tubes is 0.0001 to 0.4 wt. % based on the resin.

Item 11. A resin composition for GHz-band electronic components according to any one of items 1 to 6, wherein the nanoscale carbon tubes are nanoflake carbon tubes, and wherein the amount of the nanoscale carbon tubes is 0.0001 to 0.1 wt. % based on the resin.

Item 12. A GHz-band electronic component obtainable from a resin composition according to any one of items 1 to 11.

Item 13. A GHz-band electronic component according to item 12, which is a circuit board, an interlayer dielectric or an antenna component.

Item 14. A GHz-band electronic component according to item 12 or 13, wherein tan $\delta$ of the resin is reduced to 0.1 or lower in the GHz band while other intrinsic properties of the resin are retained.

Item 15. A method for reducing, or suppressing an increase of, tan $\delta$ of an electronic component in the GHz band, the electronic component being obtained from at least one resin selected from the group consisting of thermoplastic resins, curable resins, and composite resins of thermoplastic resins and curable resins;

the method comprising adding nanoscale carbon tubes to the resin in an amount of 0.0001 to 0.4 wt. % based on the resin.

Item 16. A method according to item 15, wherein the nanoscale carbon tubes are:
(i) single-walled carbon nanotubes or nested multilayer carbon nanotubes;
(ii) amorphous nanoscale carbon tubes;
(iii) nanoflake carbon tubes;
(iv) iron-carbon composites each composed of (a) a carbon tube selected from the group consisting of nanoflake carbon tubes and nested multi-walled carbon nanotubes, and (b) iron carbide or iron, wherein the iron carbide or iron (b) fills 10 to 90% of the internal space of the carbon tube (a); or
(v) a mixture of at least two of (i) to (iv).

Item 17. A method for reducing, or suppressing an increase of, tan $\delta$ in the GHz band, of an electronic component obtained from at least one resin selected from the group consisting of thermoplastic resins, curable resins, and composite resins of thermoplastic resins and curable resins, compared to tan $\delta$ of an electronic component obtained from the resin alone, while maintaining other intrinsic properties of the resin;

the method comprising adding nanoscale carbon tubes to the resin in an amount of 0.0001 to 0.4 wt. % based on the resin.

Item 18. A method according to item 17, wherein the nanoscale carbon tubes are:
(i) single-walled carbon nanotubes or nested multi-walled carbon nanotubes;
(ii) amorphous nanoscale carbon tubes;
(iii) nanoflake carbon tubes;
(iv) iron-carbon composites each composed of (a) a carbon tube selected from the group consisting of nanoflake carbon tubes and nested multi-walled carbon nanotubes, and (b) iron carbide or iron, wherein the iron carbide or iron (b) fills 10 to 90% of the internal space of the carbon tube (a); or (v) a mixture of at least two of (i) to (iv).

Figure 1:
FIG. 1 is a transmission electron microscope (TEM) photograph of one of the iron-carbon composites that make up the carbonaceous-material obtained in Example 1 of Japanese Unexamined Patent Publication No. 2002-338220.

The numerals in the drawings indicate the following.

100 TEM image in the lengthwise direction of a nanoflake carbon tube
110 Substantially linear graphene sheet image
200 TEM image of a cross section substantially perpendicular to the lengthwise direction of a nanoflake carbon tube
210 arc-shaped graphene sheet image
300 Image of a linear graphene sheet continuous over the entire length in the longitudinal direction of a nested multi-walled carbon nanotube
400 TEM image of a cross section perpendicular to the lengthwise direction of a nested multi-walled carbon nanotube
501 Evaluation sample
502 Inner conductor
503 Outer conductor

DETAILED DESCRIPTION OF INVENTION

The present inventors' research revealed that the above objects can be achieved by an electronic component obtained from a resin composition prepared by adding the above-mentioned nanoscale carbon tubes to a resin in an extremely small amount of 0.001 to 0.4 wt. % based on the resin. Further research revealed that the nanoscale carbon tubes, even when added in a smaller amount of 0.0001 wt. %, can also achieve the objects.

Specifically, according to the present invention, when an electronic component is obtained from a resin composition prepared by adding the nanoscale carbon tubes to a resin in an extremely small amount of 0.0001 to 0.4 wt. %, the dielectric loss tangent (δ) of the electronic component in the GHz band is reduced or suppressed from increasing, compared to electronic components obtained by using only the resin, while the intrinsic properties of the resin, such as the dielectric constant, heat resistance, mechanical strength (e.g., tensile strength, breaking elongation, hardness, etc.), chemical properties and the like, and especially dielectric properties, remain substantially unchanged.

When using a resin with a low dielectric constant, therefore, in the electronic component obtained from the resin composition according to the present invention prepared by adding a small amount of nanoscale carbon tubes to a resin having a low dielectric constant, high heat resistance, high mechanical strength and like properties, the dielectric loss tangent in the GHz band is reduced or suppressed from increasing, compared to electronic components obtained from only the resin, while the intrinsic properties, such as low dielectric constant, high heat resistance, high mechanical strength and like properties are retained.

Therefore, the use of such a resin composition provides an electronic component that can be advantageously used as a circuit board material for electrical or electronic devices, and especially a circuit board material for the GHz band, and the like.

Further, according to the present invention, since the addition of nanoscale carbon tubes suppresses an increase of dielectric loss tangent in the GHz band without deteriorating various properties (dielectric properties, thermal properties, chemical properties, mechanical properties) of the resin, the present invention has the advantage of allowing a wide selection of resins.

Nanoscale Carbon Tubes

The nanoscale carbon tubes for use in the present invention refer to carbon tubes with nanoscale diameters, which may encapsulate iron or the like in their interiors.

Examples of such nanoscale carbon tubes include (i) single-walled carbon nanotubes or multi-walled carbon nanotubes; (ii) amorphous nanoscale carbon tubes developed by the present applicant; (iii) nanoflake carbon tubes; (iv) iron-carbon composites each composed of (a) a carbon tube selected from the group consisting of nanoflake carbon tubes and nested multi-walled carbon nanotubes, and (b) iron carbide or iron, wherein the iron carbide or iron (b) fills 10 to 90% of the internal space of the carbon tube (a); and (v) a mixture of two or more thereof; etc.

Among these, the amorphous nanoscale carbon tubes, nanoflake carbon tubes and iron-carbon composites have good dispersibility in solvents and binders, and thus are preferable. The reason why these tubes and composites have good dispersibility in solvents and binders has not been completely clarified yet, but is presumably due to the fact that the discontinuous outermost hexagonal carbon layers of the tubes and composites increase the compatibility with solvents, binders, etc.

<Carbon Nanotubes>

Carbon nanotubes are hollow carbon substances in which graphite sheets (i.e., the carbon atom layers of graphite structures or graphene sheets) are rolled to form tubes, and have a diameter in the nanoscale range, and walls thereof have a graphite structure. Carbon nanotubes in which the wall is made of a single graphite sheet closed to form a tube are called single-walled carbon nanotubes, while those comprising a plurality of graphite sheets each closed to form a tube and nested in one another are called nested multi-walled carbon nanotubes. In the present invention, both single-walled carbon nanotubes and nested multi-walled carbon nanotubes can be used.

The single-walled carbon nanotubes for use in the present invention preferably have a diameter of about 0.4 to about 10 nm and a length of about 1 to about 500 μm, more preferably a diameter of about 0.7 to about 5 nm and a length of about 1 to about 100 μm, and even more preferably a diameter of about 0.7 to about 2 nm and a length of about 1 to about 20 μm.

The nested multi-walled carbon nanotubes for use in the present invention preferably have a diameter of about 1 to about 100 nm and a length of about 1 to about 500 μm, more preferably a diameter of about 1 to about 50 nm and a length of about 1 to about 100 μm, and even more preferably a diameter of about 1 to about 40 nm and a length of about 1 to about 20 μm.

<Amorphous Nanoscale Carbon Tubes>

The above-mentioned amorphous nanoscale carbon tubes are nanoscale carbon tubes of an amorphous structure that are disclosed in WO 00/40509 (Japanese Patent No. 3355442), have a main skeleton consisting of carbon, and have a diameter of 0.1 to 1000 nm. The amorphous nanoscale carbon tubes have a straight shape, and have an interlayer spacing (002) between hexagonal carbon layers of at least 3.54 Å, and preferably at least 3.7 Å, a diffraction angle ($2\theta$) of not more than 25.1 degrees, and preferably not more than 24.1 degrees, and a $2\theta$ band half-width of at least 3.2 degrees, and preferably at least 7.0 degrees, as determined by X-ray diffractometry (incident X-ray: CuKα).

The amorphous nanoscale carbon tubes are obtained by an excitation treatment of a heat-decomposable resin having a decomposition temperature of 200 to 900° C., such as, for example, polytetrafluoroethylene, polyvinylidene chloride, polyvinylidene fluoride, polyvinyl alcohol, etc., in the presence of a catalyst comprising at least one chloride of a metal such as magnesium, iron, cobalt, nickel or the like.

The heat-decomposable resin as the starting material may be in any form, such as films or sheets, powders, masses or the like. For example, to obtain a carbon material comprising a thin layer of amorphous nanoscale carbon tubes formed on a substrate, a heat-decomposable resin may be applied to or mounted on a substrate and then subjected to an excitation treatment under suitable conditions.

The excitation treatment can be carried out by, for example, heating in an inert atmosphere at a temperature that is within the range of about 450 to about 1800° C. and is not lower than the heat decomposition temperature of the starting material; plasma-treating at a temperature that is within the range from about room temperature to about 3000° C. and is not lower than the heat decomposition temperature of the starting material; or the like.

The amorphous nanoscale carbon tubes for use in the present invention are nanoscale carbon tubes with an amorphous structure, which have a hollow straight shape and highly controlled pores. The tubes usually have a cylindrical or rectangular prism shape, and most of the tubes have at least one uncapped (open) end. In the case where tubes with closed ends are present, most of these tubes have flat ends.

The amorphous nanoscale carbon tubes usually have an outer diameter of about 1 to about 1000 nm, preferably about 1 to about 200 nm, and more preferably about 1 to about 100 nm. The aspect ratio (tube length/tube diameter) is at least 2, and preferably at least 5.

As used herein, "amorphous structure" means a carbonaceous structure consisting of disordered hexagonal carbon layers, in which a large number of graphene sheets are irregularly disposed, as opposed to a graphitic structure consisting of continuous carbon layers of regularly disposed carbon atoms. In view of an image through a transmission electron microscope, which is a typical analytical means, the dimension in the planar direction of the hexagonal carbon layers of the amorphous nanoscale carbon tubes for use in the present invention is smaller than the diameter of the carbon tubes. Thus, since the wall of the amorphous nanoscale carbon tubes does not have a graphite structure, but has an amorphous structure consisting of a large number of irregularly distributed minute graphene sheets (hexagonal carbon layers), the outermost hexagonal carbon layer is not continuous but discontinuous over the entire length in the longitudinal direction of each tube. The hexagonal carbon layers constituting the outermost layer have a length of less than 20 nm, and preferably less than 5 nm.

Generally, amorphous carbon causes no X-ray diffraction but shows a broad reflection. In a graphitic structure, hexagonal carbon layers are regularly stacked on top of one another, so that spacings between the hexagonal carbon layers ($d_{002}$) are narrow. Accordingly, the broad reflection shifts towards the high-angle side ($2\theta$) and gradually narrows (has a smaller half-width of the $2\theta$ band). As a result, the reflection can be observed as a $d_{002}$ diffraction band ($d_{002}$=3.354 Å when the layers are regularly stacked on top of one another with a graphitic configuration).

In contrast, an amorphous structure generally does not cause X-ray diffraction as described above, but partially shows very weak coherent scattering. As determined by an X-ray diffractometry (incident X-ray: CuKα) using a diffractometer, the theoretical crystallographic characteristics of the amorphous nano-scale carbon tubes for use in the invention are defined as follows: the spacings between hexagonal carbon layers ($d_{002}$) are at least 3.54 Å, and preferably at least 3.7 Å; the diffraction angle ($2\theta$) is not more than 25.1 degrees, and preferably not more than 24.1 degrees; and the $2\theta$ band half-width is at least 3.2 degrees, and preferably at least 7.0 degrees.

Typically, the amorphous nanoscale carbon tubes for use in the present invention have a diffraction angle ($2\theta$) determined by X-ray diffraction (20) of 18.9 to 22.6 degrees, spacings between hexagonal carbon layers ($d_{002}$) of 3.9 to 4.7 Å, and a $2\theta$ band half-width of 7.6 to 8.2 degrees.

The term "straight" used to describe the shape of the amorphous nanoscale carbon tubes for use in the present invention refers to shape characteristics such that the ratio $L/L_O$ is at least 0.9, wherein L is the length of the image of an amorphous nanoscale carbon tube as measured by a transmission electron microscope, and $L_O$ is the length of the amorphous nanoscale carbon tube as extended linearly.

Such amorphous nanoscale carbon tubes each have a wall with an amorphous structure consisting of a plurality of minute hexagonal carbon layers (graphene sheets) oriented in various directions, and have the advantage of excellent compatibility with resins presumably because they have active points due to the spacings between the hexagonal carbon layers.

<Iron-Carbon Composites>

The iron-carbon composites for use in the present invention are disclosed in Japanese Unexamined Patent Publication No. 2002-338220 (Japanese Patent No. 3569806), and each composed of (a) a carbon tube selected from the group consisting of nanoflake carbon tubes and nested multi-walled carbon nanotubes, and (b) iron carbide or iron, wherein the iron carbide or iron (b) fills 10 to 90% of the internal space of the carbon tube (a). Specifically, the iron-carbon composites have a feature in that the iron carbide or iron does not fill 100% of the internal space of the tube, but fills 10 to 90% of (i.e., partially fills) the space. The wall of the nanoflake carbon tube has a patchwork-like or papier-mâché-like form.

In this description and the appended claims, the term "nanoflake carbon tube" refers to a carbon tube composed of a group of a plurality of (usually many) flake-like graphite sheets formed into a patchwork- or papier-mâché-like structure.

Such iron-carbon composites can be produced according to a method described in Japanese Unexamined Patent Publication No. 2002-338220, the method comprising:

(1) heating an iron halide to 600 to 900° C. in a reaction furnace in which the pressure has been adjusted to $10^{-5}$ Pa to 200 kPa in an inert gas atmosphere and the oxygen concentration in the reaction furnace has been adjusted such that the ratio B/A is between $1\times10^{-10}$ and $1\times10^{-1}$ wherein A is the reaction furnace volume (liters) and B is the amount of oxygen (Ncc), and (2) introducing an inert gas into the reaction furnace, and at a pressure of between $10^{-5}$ Pa and 200 kPa, introducing thereinto a pyrolyzable carbon source and performing a heat treatment at 600 to 900° C.

The term "Ncc" herein, which is the unit of the oxygen quantity B, means the volume (cc) of the gas in its normal state at 25° C.

The iron-carbon composites for use in the present invention each comprise (a) a carbon tube selected from the group consisting of nanoflake carbon tubes and nested multi-walled carbon nanotubes and (b) iron carbide or iron. Rather than substantially all the internal space (i.e., the spaces defined by the tube walls) of the carbon tube being filled, a part of the space, more specifically about 10 to 90%, preferably about 30 to 80%, and more preferably about 40 to 70%, of the space is filled with iron carbide or iron.

In the iron-carbon composites for use in the present invention, as described in Japanese Unexamined Patent Publication No. 2002-338220, the carbon portion becomes nanoflake carbon tubes when cooling is carried out at a specific rate after steps (1) and (2), or becomes nested multi-walled carbon nanotubes when a heat treatment in an inert gas atmosphere and cooling at a specific rate are carried out after steps (1) and (2).

<(a-1) Nanoflake Carbon Tubes>

Figure 3:
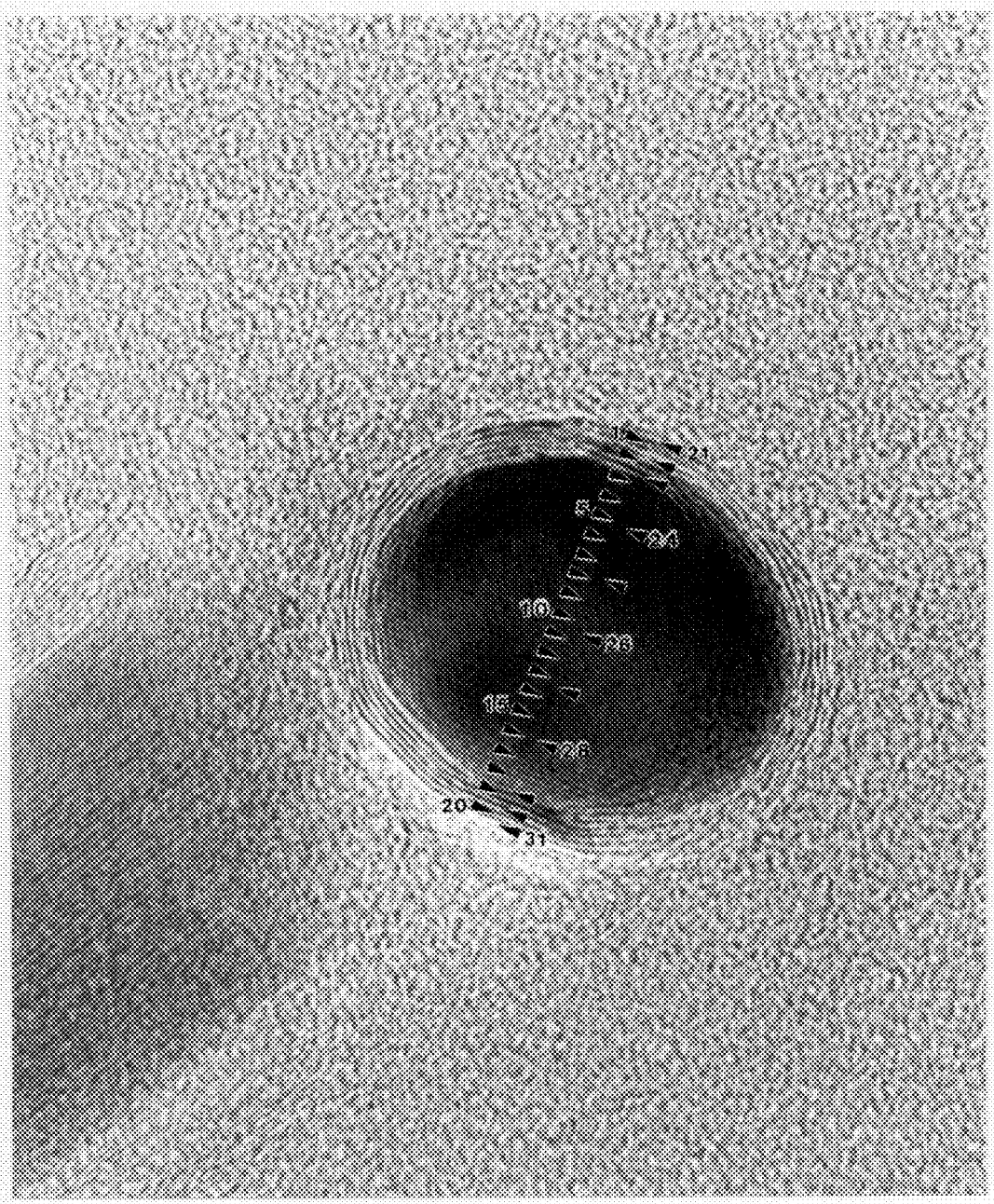
FIG. 3 is a transmission electron microscope (TEM) photograph of one of the iron-carbon composites obtained in Example 1 of Japanese Unexamined Patent Publication No. 2002-338220, which has been cut crosswise. The black triangles (▲) shown in the photograph of FIG. 3 indicate EDX measurement points for elemental analysis.

The iron-carbon composites for use in the present invention comprising nanoflake carbon tubes and iron carbide or iron, are typically cylindrical in shape. FIG. 3 shows a transmission electron microscope (TEM) photograph of a cross section substantially perpendicular to the lengthwise direction of such a cylindrical iron-carbon composite (obtained in Example 1 of Japanese Unexamined Patent Publication No. 2002-338220). FIG. 1 shows a TEM photograph of the side thereof.

Figure 4:
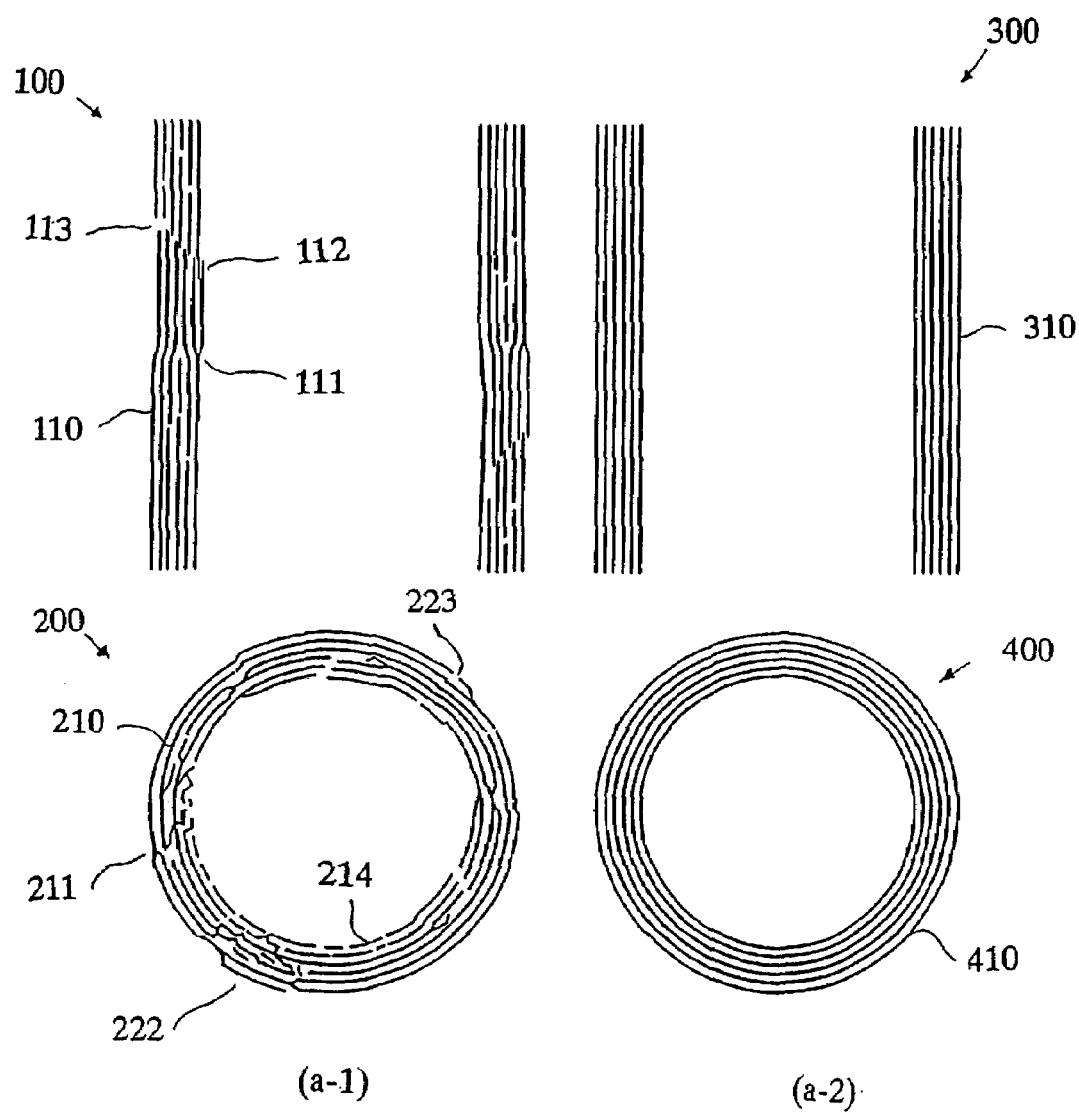
FIG. 4 is a set of schematic diagrams of TEM images of carbon tubes wherein (a-1) is a schematic diagram of a TEM image of a cylindrical nanoflake carbon tube, and (a-2) is a schematic diagram of a TEM image of a nested multi-walled-carbon nanotube.

FIG. 4 (*a*-1) is a schematic diagram of a TEM image of such a cylindrical nanoflake carbon tube. In FIG. 4 (*a*-1), 100 schematically shows a TEM image of the lengthwise direction of the nanoflake carbon tube, while 200 schematically shows a TEM image of a cross section substantially perpendicular to the lengthwise direction of the nanoflake carbon tube.

The nanoflake carbon tubes constituting the iron-carbon composites for use in the present invention typically have a hollow cylindrical shape. When the cross section of one of the nanoflake carbon tubes is viewed by TEM, it can be seen that arc-shaped graphene sheet images are concentrically grouped and individual graphene sheet images form discontinuous rings; and when the lengthwise direction of the nanoflake carbon tube is viewed by TEM, approximately straight-shaped graphene sheet images are arranged in layers substantially parallel to the lengthwise direction, and the individual graphene sheet images are not continuous over the entire length of the carbon tube, and are instead broken in places.

More specifically, as is clear from FIG. 3 and 200 in FIG. 4 (*a*-1), when a cross section perpendicular to the lengthwise direction is observed by TEM, each nanoflake carbon tube in the iron-carbon composites for use in the present invention has such a structure that numerous arc-shaped graphene sheet images are grouped concentrically (in a multi-walled tubular form), but as indicated by, e.g., 210 and 214, the individual graphene sheet images do not form completely closed, continuous rings, and instead form non-continuous rings that are broken in places. Some of the graphene sheet images may be branched, as indicated by 211. At the non-continuous areas, a plurality of arc-shaped TEM images that make up one non-continuous ring may be such that the layer structure is partially disturbed as indicated by 222 in FIG. 4 (*a*-1), or there may be gaps between adjacent graphene sheet images as indicated by 223. However, the numerous arc-shaped graphene sheet images observed by TEM, taken together, form a multi-walled tube structure.

As is clear from FIG. 1 and 100 in FIG. 4 (*a*-1), when the nanoflake carbon tube is viewed in the lengthwise direction by TEM, it can be seen that numerous substantially linear graphene sheet images are arranged in layers substantially parallel to the lengthwise direction of each iron-carbon composite for use in the present invention, but the individual graphene sheet images 110 are not continuous over the entire length of the iron-carbon composite, and are instead broken in places. Some of the graphene sheet images may be branched, as indicated by 111 in FIG. 4 (*a*-1). Among the TEM images arranged in layers at the non-continuous points, the TEM image of a non-continuous layer may at least partially overlap an adjacent graphene sheet image as indicated by 112 in FIG. 4 (*a*-1), or it may be slightly apart from an adjacent graphene sheet image as indicated by 113, but the numerous substantially linear TEM images, taken together, form a multi-walled structure.

Such a structure of the nanoflake carbon tubes for use in the present invention greatly differs from that of conventional multi-walled carbon nanotubes. Specifically, a nested multi-walled carbon nanotube has a tube structure (a concentric cylindrical or nested structure) in which, as indicated by 400 in FIG. 4 (*a*-2), the TEM image of a cross section perpendicular to the lengthwise direction thereof is in a concentric circular form comprising substantially perfectly circular TEM images as indicated by 410, and as indicated by 300 in FIG. 4 (*a*-2), linear graphene sheet images 310 which are continuous over the entire length in the longitudinal direction are arranged in parallel.

In view of the above, although the details are not yet fully clarified, the nanoflake carbon-tubes in the iron-carbon composites for use in the present invention appear to have such a structure that numerous flaky graphene sheets are stacked in a patchwork- or papier-mâché-like structure and, taken together, form a tube.

The iron-carbon composites for use in the present invention, each of which comprises a nanoflake carbon tube and iron carbide or iron contained in the internal space of the tube, greatly differ in carbon tube structure from the composites disclosed in Japanese Patent No. 2546114 in which a metal is contained in the internal space of nested multi-walled carbon nanotubes.

When the nanoflake carbon tubes of the iron-carbon composites for use in the present invention are observed by TEM, with respect to the numerous substantially linear graphene sheet images arranged in the lengthwise direction thereof, the length of the individual graphene sheet images is usually about 2 to 500 nm, and particularly about 10 to 100 nm. Specifically, as indicated by 100 in FIG. 4 (*a*-1), numerous TEM images of the substantially linear graphene sheets indicated by 110 are grouped together to constitute a TEM image of the wall of a nanoflake carbon tube, and the length of the individual substantially linear graphene sheet images is usually about 2 to 500 nm, and preferably about 10 to 100 nm.

As described above, in the iron-carbon composite, the outermost layer of the wall of each nanoflake carbon tube is formed from discontinuous graphene sheets that do not continue over the entire length in the lengthwise direction of the tube, and the outermost hexagonal carbon layer has a length of about 2 to about 500 nm, and preferably about 10 to about 100 nm.

While the carbon portion, i.e., the wall of each nanoflake carbon tube in the iron-carbon composites for use in the present invention, is composed of numerous flake-like graphene sheets which are arranged in the lengthwise direction to form a tube as a whole as discussed above, the wall has a graphitic structure in which the mean spacing between the hexagonal carbon layers (d002) is not more than 0.34 nm as determined by X-ray diffractometry.

The thickness of the wall of each nanoflake carbon tube of the iron-carbon composites for use in the present invention is not more than 49 nm, preferably about 0.1 to about 20 nm, and more preferably about 1 to about 10 nm, and is substantially uniform over the entire length.

<(a-2) Nested Multi-Walled Carbon Nanotubes>

By carrying out steps (1) and (2) as mentioned above and then performing a specific heating step, the carbon tubes in the obtained iron-carbon composites become nested multi-walled carbon nanotubes.

The nested multi-walled carbon nanotubes thus obtained have a tube structure (a concentric cylindrical or nested structure) in which, as indicated by 400 in FIG. 4 (*a*-2), the TEM image of a cross section perpendicular to the lengthwise direction thereof is in a concentric circular form comprising substantially perfect circles, and graphene sheet images which are continuous over the entire length in the lengthwise direction are arranged in parallel.

The carbon portion, i.e., the wall of each nested multi-walled carbon tube of the iron-carbon composites for use in the present invention, is of a graphitic structure in which the mean spacing between the hexagonal carbon layers (d002) is not more than 0.34 nm as determined by X-ray diffractometry.

The thickness of the wall of the nested multi-walled carbon nanotubes of the iron-carbon composites for use in the present invention is not more than 49 nm, preferably about 0.1 to 20 nm, and more preferably about 1 to 10 nm, and is substantially uniform over the entire length.

<(b) Contained Iron Carbide or Iron>

In this specification, the filling proportion (10 to 90%) of iron carbide or iron in the internal space of a carbon tube selected from the group consisting of nanoflake carbon tubes and nested multi-walled carbon nanotubes is determined by transmission electron microscope observation of the iron-carbon composites for use in the present invention, and is the proportion of the area of an image of the portion filled with iron carbide or iron relative to the area of an image of the internal space of the carbon tube (that is, the space defined by the wall of the carbon tube).

The iron carbide or iron can be contained in the tubes in various ways, such as the carbon tube internal spaces being continuously filled, or the carbon tube internal spaces being intermittently filled, but generally the spaces are intermittently filled. Therefore, the iron-carbon composites for use in the present invention may also be called metal-containing carbon composites, iron-compound-containing carbon composites, or iron-carbide- or iron-containing carbon composites.

The iron carbide or iron contained in the iron-carbon composites for use in the present invention is oriented in the lengthwise direction of the carbon tubes, and has high crystallinity, and the proportion of the area of a TEM image of crystalline iron carbide or iron relative to the area of a TEM image of the region filled with iron carbide or iron (hereinafter referred to as the "crystallinity ratio") is generally about 90 to 100%, and preferably about 95 to 100%.

The high crystallinity of the contained iron carbide or iron is clear from the lattice pattern arrangement shown in the TEM image of the contained substance taken from the side of the iron-carbon composites, and is also clear from the distinct diffraction pattern obtained in electron beam diffraction.

The presence of iron carbide or iron as contained in the iron-carbon composites for use in the present invention can be easily confirmed by electron microscopy and EDX (energy dispersive X-ray analyzer).

<Overall Shape of Iron-Carbon Composites>

The iron-carbon composites for use in the present invention have slight curvature, a straight shape and a wall thickness substantially uniform over the entire length, and therefore have a uniform shape over the entire length. The shape is columnar, and mainly cylindrical.

The outer diameter of the iron-carbon composites for use in the present invention is usually in the range of about 1 to about 100 nm, particularly about 1 to about 50 nm, preferably about 1 to about 30 nm, and more preferably about 10 to about 30 nm. The aspect ratio (L/D) of the tube length (L) to its outer diameter (D) is about 5 to about 10000, particularly about 10 to about 1000.

The term "straight shape" used to describe the shape of the iron-carbon composites for use in the present invention is defined as a shape characteristic such that the ratio W/Wo is at least 0.8, and particularly at least 0.9, wherein W is the length of the image of a carbonaceous material comprising the iron-carbon composites for use in the present invention observed over an area of 200 to 2000 nm square with a transmission electron microscope, and Wo is the length when said image has been extended linearly.

The iron-carbon composites for use in the present invention have the following properties when considered as a bulk material. Specifically, in the present invention, the iron-carbon composites, in each of which iron or iron carbide fills 10 to 90% of the internal space of a carbon tube selected from the group consisting of the above-mentioned nanoflake carbon tubes and nested multi-walled carbon nanotubes, are a bulk material comprising numerous iron-carbon composites and are obtained in a large quantity in the form of a material that should also be called a carbonaceous material comprising iron-carbon composites, or an iron carbide- or iron-containing carbonaceous material, as opposed to a minute amount, which can be barely observed by microscopic observation.

Figure 2:
FIG. 2 is a transmission electron microscope (TEM) photograph showing how the iron-carbon composites are present in the carbonaceous material obtained in Example 1 of Japanese Unexamined Patent Publication No. 2002-338220.

FIG. 2 is an electron micrograph of the carbonaceous material for use in the present invention, obtained in Example 1 of Japanese Unexamined Patent Publication No. 2002-338220, the material comprising nanoflake carbon tubes and iron carbide contained in the internal spaces of the tubes.

As seen from FIG. 2, in the carbonaceous material comprising the iron-carbon composites for use in the present invention, iron or iron carbide fills 10 to 90% of the internal space (that is, the space surrounded by the walls of the carbon tubes) of basically almost all (particularly 99% or more) of the carbon tubes, and usually there are substantially no carbon tubes whose internal space is empty. In some cases, however, a minute amount of carbon tubes not containing iron carbide or iron may be contained.

Also, with the carbonaceous material for use in the present invention, the above-mentioned iron-carbon composites in which iron or iron carbide fills 10 to 90% of the internal spaces of the carbon tubes are the main component, but there may be cases in which soot or other such materials are included besides the iron-carbon composites for use in the present invention. In such a case, any components other than the iron-carbon composites can be removed so as to increase the iron-carbon composite purity in the carbonaceous material, and to thereby obtain a carbonaceous material consisting essentially of the iron-carbon composites.

Also, unlike prior art materials that could only be observed in minute amounts by microscopic observation, the carbonaceous material containing iron-carbon composites for use in the present invention can be synthesized in large quantities, and a weight of 1 mg or more can be easily achieved.

In the powder X-ray diffraction measurement of the carbonaceous material in which the carbonaceous material is irradiated with a CuKα X-ray over an irradiation area of at least 25 mm$^2$ per mg of the carbonaceous material, the ratio R (=Ia/Ib) is preferably about 0.35 to about 5, particularly about 0.5 to about 4, and more preferably about 1 to about 3, wherein Ia is the integrated intensity of the peak having the strongest integrated intensity among the peaks appearing in the range of 40°<2θ<50° assigned to iron or iron carbide contained in the carbon tubes, and Ib is the integrated intensity of the peak appearing in the range of 26°<2θ<27° assigned to the mean spacing between the hexagonal carbon layers (d002) of the carbon tubes.

In this specification, the above ratio of Ia/Ib is called the R value. Since the peak intensity is viewed as an average value among the carbonaceous material as a whole when the carbonaceous material comprising iron-carbon composites for use in the present invention is observed by X-ray diffraction over an X-ray irradiation area of at least 25 mm$^2$, this R value does not represent the content or filling proportion of iron carbide or iron in the single iron-carbon composite that can be measured by TEM analysis, but represents an average value of the iron carbide or iron content or filling proportion for the carbonaceous material as a whole, which comprises a group of iron-carbon composites.

Furthermore, the average filling proportion for the entire carbonaceous material containing a large number of the iron-carbon composites can also be determined by observing various fields by TEM, measuring the average iron carbide- or iron-filling proportion in various iron-carbon composites observed in each field, and calculating the average value of the average filling proportions in said various fields. With this measurement process, the average iron carbide- or iron-filling proportion for the entire carbonaceous material comprising the iron-carbon composites is about 10 to 90%, and preferably about 40 to 70%.

<Nanoflake Carbon Tubes>

By acid treatment of the iron-carbon composites in which iron or iron carbide partially fills the internal spaces of nanoflake carbon tubes, the iron or iron carbide contained therein is dissolved, whereby hollow nanoflake carbon tubes, which do not contain iron or iron carbide in their internal spaces, can be obtained Acids usable for the acid treatment include hydrochloric acid, sulfuric acid, nitric acid, hydrofluoric acid, etc. The concentration of such an acid is preferably about 0.1 to about 2N. The acid treatment can be carried out in various ways. For example, 1 g of iron-containing nanoflake carbon tubes is dispersed in 100 ml of 1N hydrochloric acid, and the dispersion is stirred at room temperature for 6 hours and filtered, followed by two cycles of the same steps using 100 ml of 1N hydrochloric acid, to thereby obtain hollow nanoflake carbon tubes.

Such an acid treatment does not substantially change the basic structure of the nanoflake carbon tubes. Therefore, in the hollow nanoflake carbon tubes containing no iron or iron carbide in the internal spaces thereof, the outermost hexagonal carbon layer has a length of not more than 500 nm, preferably 2 to 500 nm, and more preferably 10 to 100 nm.

Resin

The resin for use in the present invention is at least one resin selected from the group consisting of thermoplastic resins, curable resins, and composite resins of thermoplastic resins and curable resins, which are employed in the field of electronic components.

A wide variety of thermoplastic resins can be used in the present invention, and examples thereof include polyolefin resins (e.g., polyethylene resins, polypropylene resins, poly-1-butene resins, poly-4-methyl-1-pentene resins, and like linear polyolefin resins; 5-methylpentene resins, polynorbornene resins, and like cyclic polyolefin resins containing cyclic olefins; etc.), polyester resins (e.g., polyethylene terephthalate, polybutylene terephthalate, polyethylene naphthalate-polyethylene glycol block copolymers, etc.), polyamide resins (e.g., nylon 4, nylon 6, nylon 6.6, nylon 6.10, nylon 12, etc.), fluororesins (e.g., polytetrafluoroethylene resins, polytrifluoroethylene resins and the like; and ethylene/tetrafluoroethylene copolymers, tetrafluoroethylene/hexafluoropropylene copolymers, tetrafluoroethylene/perfluoroalkoxy vinyl ether copolymers and like heat-fusible fluororesins; etc.), polystyrene resins, polyvinyl chloride resins, methacrylate and acrylate resins (e.g., polymethylmethacrylate, polymethylacrylate, etc.), polycarbonate resins, polysulfone resins, polyethersulfone resins, polyphenylene sulfide resins, polyphenylene ether-based resins (in particular, polyphenylene ether; polyphenylene ether resins in which a small amount of polystyrene or styrene-butadiene-based elastomer has been added to improve the impact resistance and moldability; etc.), ABS resins (e.g., heat-resistant ABS resins whose heat deflection temperature has been improved by copolymerization with maleimide), polyetheretherketone resins, liquid crystal polymers, (e.g., thermotropic liquid crystal polyester resins and the like), thermoplastic polyimide resins, polyetherimide resins, polyacetals, polyarylates, polyethernitrile resins, etc. In the present invention, such thermoplastic resins may be used singly or at least two of them may be used in combination.

Representative examples of curable resins usable in the present invention include thermosetting resins, photocurable resins, electron-beam-curable resins, etc., all of which have properties such that they can be cured by external energy, such as heat, light, an electron beam or the like, for processing or molding.

Examples of thermosetting resins include epoxy resins (e.g., cresol novolac epoxy resins, phenol novolac epoxy resins, biphenyl epoxy resins, various novolac epoxy resins synthesized from bisphenol A, resorcinol, etc., bisphenol-A epoxy resins, brominated bisphenol A epoxy resins, linear aliphatic epoxy resins, alicyclic epoxy resins, heterocyclic epoxy resins, halogenated epoxy resins, spirocyclic epoxy resins, etc.), diallyl phthalate resins, silicone resins, phenol resins, unsaturated polyester resins, polyimide resins, polyurethane resins, furan resins, urea resins, melamine resins, triazine-based resins (e.g., bismaleimide triazine resins (BT resins) and the like), curable polyphenylene ether resins, crosslinkable polyphenylene oxides, maleimide-based resins, alkyd resins, xylene resins, etc. In the present invention, such thermosetting resins can be used singly or at least two of them may be in combination.

If necessary, polymerization initiators (curing agents) can be added to such thermosetting resins. Examples of curing agents for epoxy resins include amine-based curing agents, polyamide-based curing agents, acid anhydride-based curing agents, latent curing agents, etc., and compounds having an active group reactive with an epoxy group (preferably an amino group, acid anhydride group, azido group or hydroxy group) are suitable. More specifically, examples of amine-based curing agents include aliphatic amines, alicyclic amines, aromatic amines, etc.; examples of polyamide-based curing agents include polyamide amines and the like; examples of acid anhydride-based curing agents include aliphatic acid anhydrides, alicyclic acid anhydrides, aromatic acid anhydrides, halogenated acid anhydrides, etc.; and examples of latent curing agents include high-melting-point active hydrogen compounds (dicyandiamides, organic acid dihydrazides, etc.), tertiary amine.imidazole salts (salts of Lewis acids, Bronsted acids, etc.). These examples, however, are not limitative. Examples of curing agents for silicone resins include aminoxysilanes and the like. Examples of curing agents for unsaturated polyester resins include benzoyl peroxide (BPO), methyl ethyl ketone peroxide (MEKPO), organic peroxides (e.g., hydroperoxides, dialkyl peroxides, peroxyesters, diacyl peroxides, peroxydicarbonates, peroxyketals, ketone peroxides, etc.), and the like.

Such curing agents can be used in amounts conventionally used for respective thermosetting resins, and are preferably used in an amount of about 0.3 to about 5 parts by weight, and especially about 1 to about 3 parts by weight, per 100 parts by weight of the thermosetting resin.

The curable resin for use in the present invention may be a photocurable resin obtained by imparting photocurability to a resin. Examples of such photocurable resins are various known resins, and include acrylic resins, silicone resins, ester resins, etc. Representative examples include acryloyl group-containing UV-curable resins, such as mixtures of the following monomers or oligomers or polymers: epoxy acrylate-based, urethane acrylate-based, polyester acrylate-based or polyol acrylate-based oligomers and polymers; and also include monofunctional, bifunctional and polyfunctional polymerizable (meth)acrylic compounds, such as tetrahydrofurfuryl acrylate, 2-hydroxyethyl acrylate, 2-hydroxy-3-phenoxypropyl acrylate, polyethylene glycol diacrylate, polypropylene glycol diacrylate, trimethylol propane triacrylate, pentaerythritol triacrylate, pentaerythritol tetraacrylate and like monomers, and oligomers and polymers. Such photocurable resins may be used singly or at least two of them may be used in combination.

Conventionally used photoinitiators (if necessary, in combination with photopolymerization accelerators) can be added in conventional amounts to the photocurable resin.

Such photoinitiators are preferably substances that absorb UV light and easily generate radicals, and acetophenone-based, thioxanthone-based, benzoin-based and peroxide-based known substances may be used. Examples include diethoxyacetophenone, 4-phenoxydichloroacetophenone, benzoin, benzoin ethyl ether, benzoin isopropyl ether, benzyl dimethyl ketal, benzophenone, 4-phenyl benzophenone, acrylated benzophenone, thioxanthone, 2-ethylanthraquinone, etc.

Such photoinitiators can be used in amounts conventionally used for respective photocurable resins, and is preferably used in an amount of about 0.3 to about 5 parts by weight, and particularly about 1 to about 3 parts by weight, per 100 parts by weight of photocurable resin.

Photopolymerization accelerators accelerate initiation reactions, compared to cases where only photoinitiators are used, to thereby achieve efficient curing reactions, and known photoinitiator aids such as aliphatic and aromatic amines and the like are usable. Examples thereof include triethanolamine, N-methyldiethanolamine, Michler's ketone, 4,4-diethylaminophenone, etc.

Such photopolymerization accelerator, if employed, is used in a conventional amount for respective photocurable resins, and it is generally preferable that the amount thereof is about 0.3 to about 5 parts by weight, particularly about 1 to about 3 parts by weight, per 100 parts by weight of photocurable resin.

The curable resin for use in the present invention may be an electron-beam-curable resin. Various known electron-beam-curable resins are usable, and examples thereof include (A) acrylates of aliphatic, alicyclic and aromatic, monohydric to hexahydric alcohols and polyalkylene glycols; (B) acrylates of alkylene oxide adducts of aliphatic, alicyclic and aromatic, monohydric to hexahydric alcohols; (C) polyacryloylalkyl phosphoric acid esters; (D) reaction products of carboxylic acids, polyols and acrylic acid; (E) reaction products of isocyanates, polyols and acrylic acid; (F) reaction products of epoxy compounds and acrylic acid; and (G) reaction products of epoxy compounds, polyols and acrylic acid.

More specifically, it is preferable that the electron-beam-curable resin is selected from polyoxyethylene epichlorohydrin-modified bisphenol A diacrylates, dicyclohexyl acrylate, epichlorohydrin-modified polyethylene glycol diacrylates, 1,6-hexanediol diacrylate, neopentylglycol hydroxypivalate diacrylate, nonylphenoxy polyethylene glycol acrylates, ethylene oxide-modified phenoxylated phosphoric acid acrylates, ethylene oxide-modified phthalic acid acrylates, polybutadiene acrylates, caprolactam-modified tetrahydrofurfuryl acrylates, tris(acryloxyethyl)isocyanurate, trimethylolpropane triacrylate, pentaerythritol triacrylate, pentaerythritol tetraacrylate, dipentaerythritol hexaacrylate, polyethylene glycol diacrylates, 1,4-butadiene diol diacrylate, neopentyl glycol diacrylate, neopentyl glycol-modified trimethylolpropane diacrylates, etc.

In the present invention, thermoplastic resin(s) and curable resin(s) can also be used together in the form a composite resin. In this case, such a composite resin may be a thermoplastic resin having cured curable resin dispersed therein, or a thermosetting resin having a thermoplastic resin dispersed therein.

Resin compositions comprising such resins and nanoscale carbon tubes have reduced tan δ, compared to the resins themselves (matrices), while having other properties, i.e., dielectric constant, mechanical strength, heat resistance, etc., that are equivalent to those of the resins. As a result, such resin compositions give electronic components suitable for various applications.

Among the above-mentioned resins, preferable are:
(1) polyolefin resins, polyester resins, polyamide resins, fluororesins, polystyrene resins, polyvinyl chloride resins, polymethyl (meth)acrylate resins, polycarbonate resins, polyethersulfone resins, and like thermoplastic resins;
(2) polyimide resins, bismaleimide triazine resins (BT resins), crosslinkable polyphenylene oxides, curable polyphenylene ethers, phenol resins, melamine resins, urea resins, unsaturated polyester resins, alkyd resins, diallyl phthalate resins, xylene resins, epoxy resins, epoxy acrylate resins, urethane acrylate resins, polyester acrylate resins, polyol acrylate resins, and like curable resins.

Resin Composition

The resin composition of the present invention comprises the resin and nanoscale carbon tubes described above.

The resin composition of the present invention is characterized in that it comprises nanoscale carbon tubes in an amount of 0.0001 to 0.4 wt. % based on the resin. It has not been clarified by what mechanism addition of such a trace amount of nanoscale carbon tubes reduces the dielectric loss tangent in the GHz band, but presumably, the mechanism is such that when a trace amount of nanoscale carbon tubes is homogeneously dispersed, the nanoscale carbon tubes physically compensate the change in the electric field of the dipole created by dielectric polarization of polar groups contained in the resin. Less than 0.0001 wt. % of nanoscale carbon tubes does not exhibit satisfactory effects, whereas more than 0.4 wt. % thereof instead increases the dielectric loss tangent.

The amount of nanoscale carbon tubes is preferably 0.0005 to 0.4 wt. %, more preferably 0.001 to 0.4 wt. %, and particularly 0.001 to 0.3 wt. %, based on the resin. Still more preferably, the amount of nanoscale carbon tubes is 0.001 to 0.2 wt. %, and especially 0.001 to 0.1 wt. %, based on the resin.

When the nanoscale carbon tubes are single-walled carbon nanotubes or nested multi-walled carbon nanotubes as described above, the amount thereof is preferably 0.0001 to 0.1 wt. %, and especially 0.0001 to 0.05 wt. %, based on the resin.

When the nanoscale carbon tubes are amorphous nanoscale carbon tubes as described above, the amount thereof is preferably 0.0001 to 0.1 wt. %, and especially 0.0001 to 0.05 wt. %, based on the resin.

When the nanoscale carbon tubes are iron-carbon composites as described above, the amount thereof is preferably 0.0001 to 0.4 wt. %, and especially 0.01 to 0.4 wt. %, based on the resin.

When the nanoscale carbon tubes are nanoflake carbon tubes as described above, the amount thereof is preferably 0.0001 to 0.1 wt. %, and especially 0.0001 to 0.05 wt. %, based on the resin.

In the present invention, when a thermosetting resin is used, the amount of nanoscale carbon tubes is expressed relative to the weight of the thermosetting resin (when a curing agent is used for curing the thermosetting resin, the total weight of the thermosetting resin and curing agent). For example, when an epoxy resin is used as the thermosetting resin, the amount of nanoscale carbon tubes is 0.0001 to 0.4 wt. % as mentioned above, relative to the total weight of the epoxy resin and the curing agent used for curing the epoxy resin.

Similarly, when the resin for use in the present invention is a photocurable resin, the amount of nanoscale carbon tubes is expressed relative to the total of (a) the weight of the photocurable resin component (oligomer, monomer, etc.) and (b) the weight of the photoinitiator used for curing the photocurable resin (plus the weight of any photopolymerization accelerator when used). For example, when a UV-curable acrylic resin is used, the amount of nanoscale carbon tubes is 0.0001 to 0.4% as mentioned above, relative to the total of (a) the weight of the UV-curable acrylic resin and (b) the weight of the photoinitiator used for curing the resin (plus the weight of any optionally used photopolymerization accelerator).

Various processes can be employed to produce the resin composition of the present invention. When using a thermoplastic resin, the composition can be produced by, for example, a process which comprises dissolving the thermoplastic resin in a solvent that can dissolve the thermoplastic resin to obtain a thermosetting resin solution, adding nanoscale carbon tubes to the solution, and evaporating the solvent from the resulting mixture; a process which comprises heating and melting the thermoplastic resin to form a liquid, adding nanoscale carbon tubes to the liquid, and kneading the resulting mixture to homogeneity; or like process.

When using a thermosetting resin, nanoscale carbon tubes can be mixed with the thermoplastic resin before curing, since uncured thermosetting resins are usually in a liquid state. Uncured photocurable resins and uncured electron-beam-curable resins are also usually in a liquid state, and thus nanoscale carbon tubes can be mixed with such resins before curing.

The resin composition of the present invention may contain, as required, various additives conventionally used in this field, such as antioxidants, as long as they do not impair the effects of the invention.

The composition of the present invention can be obtained by mixing the resin, nanoscale carbon tubes, and optionally additives as mentioned above. Mixing can be performed by known processes, such as processes using ceramic three-roll mills, paint shakers, planetary mills, etc.

Electronic Components

Since the composition of the present invention provides a resin product with a low dielectric constant, low dielectric loss tangent, high heat resistance and high mechanical strength, it can be advantageously used as a circuit board material for electrical and electronic devices, and especially as a circuit board material for GHz-band devices. In particular, since an increase of dielectric loss tangent in the GHz band can be suppressed without deteriorating the characteristics possessed by resins with various improved properties (dielectric properties, thermal properties, chemical properties, mechanical properties), the range of selectable resins is broadened.

The electronic component of the present invention has the above properties over a wide range of GHz band of 1 GHz and higher. Generally, the electronic component exhibits the above-mentioned remarkable effects at 1 to 20 GHz, and in particular 1 to 10 GHz.

Specifically, the resin composition of the present invention can be used very advantageously as a printed circuit board material for high frequency devices such as satellite broadcasting-related devices, and information processing devices. Further, the resin composition of the present invention can be used in wide applications including, for example, semiconductor packaging components such as chip carriers, pin grid arrays, etc.; passive elements such as resistors, switches, capacitors, photosensors, etc.; and mechanism components such as IC sockets, connectors, etc. The composition can also be used for containers for use in microwave ovens. In particular, the composition is useful for producing an insulating material for circuit boards, interlayer dielectrics, antenna components, insulation materials for high frequency coaxial cables, etc.

Such electronic components can be produced by known processes. For example, a printed circuit board can be obtained by molding the composition of the present invention into a sheet, on which surface a film of a metal such as copper is formed by plating or like method, and forming circuits in a conventional manner.

The composition of the present invention can be molded by known molding processes, such as injection molding, extrusion, compression molding, cast molding, etc.

In the electronic component of the present invention, which is obtained from the resin composition of the present invention prepared by adding nanoscale carbon tubes, and in particular nanoscale carbon tubes mentioned in item 2 or 3, to a resin in an extremely minute amount of 0.0001 to 0.4 wt. % based on the resin, the dielectric loss tangent (tan δ) in the GHz band is reduced, compared to the case where only the resin is used, or alternatively the increase of tan δ in the GHz band, which occurs when only the resin is used, is suppressed.

Therefore, the present invention also provides a method for reducing, or suppressing an increase of, tan δ of an electronic component in the GHz band, the electronic component being obtained from at least one resin selected from the group consisting of thermoplastic resins, curable resins, and composite resins of thermoplastic resins and curable resins; the method comprising adding nanoscale carbon tubes, and in particular nanoscale carbon tubes mentioned in item 2 or 3, to the resin in an amount of 0.0001 to 0.4 wt. % based on the resin.

The present invention also provides the use of nanoscale carbon tubes, and in particular nanoscale carbon tubes mentioned in item 2 or 3, for reducing, or suppressing an increase of, tan δ of an electronic component in the GHz band, the electronic component being obtained from at least one resin selected from the group consisting of thermoplastic resins, curable resins, and composite resins of thermoplastic resins and curable resins.

Further, in the electronic component of the present invention, which is obtained from the resin composition of the present invention prepared by adding nanoscale carbon tubes, and in particular nanoscale carbon tubes mentioned in item 2 or 3, to a resin in an amount of 0.0001 to 0.4 wt. % based on the resin, the dielectric loss tangent (tan δ) in the GHz band is reduced, compared to the case where only the resin is used, or alternatively, an increase of tan δ in the GHz band, which occurs when only the resin is used, is suppressed, while the intrinsic properties of the resin, such as dielectric constant, heat resistance, mechanical strength, etc., remain substantially unchanged.

Thus, the present invention also provides a method for reducing, or suppressing an increase of, tan δ, in the GHz band, of an electronic component obtained from at least one resin selected from the group consisting of thermoplastic resins, curable resins, and composites of thermoplastic resins and curable resins, while maintaining the intrinsic properties of the resin, such as dielectric constant, heat resistance, mechanical strength (e.g., tensile strength, breaking elongation, hardness, etc.), chemical properties, and especially dielectric properties; the method comprising adding nanoscale carbon tubes, and in particular nanoscale carbon tubes mentioned in item 2 or 3, to the resin in an amount of 0.0001 to 0.4 wt. % based on the resin.

The present invention also provides use of nanoscale carbon tubes, in particular nanoscale carbon tubes according to item 2 or 3, for reducing, or suppressing an increase of, tan δ of an electronic component in the GHz band, the electronic component being obtained from at least one resin selected from the group consisting of thermoplastic resins, curable resins, and composite resins of thermoplastic resins and curable resins, while maintaining other intrinsic properties of the resin.

EXAMPLES

Reference Examples (Production Examples of nanoscale carbon tubes), Examples and Comparative Examples are given below to describe the present invention in further detail. However, Examples are not intended to limit the scope of the invention, and various modifications can be made thereto.

Reference Example 1

Production of Amorphous Nanoscale Carbon Tubes

Amorphous nanoscale carbon tubes were produced by the following process.

Ten milligrams of an anhydrous iron chloride powder (particle diameter: not more than 500 μm) was uniformly sprinkled over a PTFE film (60 μm×10 mm×10 mm), and subjected to plasma excitation. The plasma excitation conditions were as follows.
Atmosphere: argon (Ar)
Internal pressure: 0.01 torr
Input power: 300 W
RF frequency: 13.56 MHz After the reaction, the formation of amorphous nanoscale carbon tubes (outer diameter: 10-60 nm, length: 5-6 μm) was confirmed by scanning electron microscopy (SEM) and X-ray diffraction.

The X-ray diffraction angle (2θ) of the obtained amorphous nanoscale carbon tubes was 19.1 degrees, the hexagonal carbon layer spacing (d002) calculated therefrom was 4.6 Å, and the 2θ band half-width was 8.1 degrees.

Reference Example 2

Using toluene as a raw material and ferric chloride as a catalyst, a reaction was carried out according to the process described in Japanese Unexamined Patent Publication No. 2002-338220, to thereby obtain a carbonaceous material comprising iron-carbon composites which are composed of nanoflake carbon tubes having internal spaces partially filled with iron carbide.

SEM observation revealed that the obtained iron-carbon composites had an outer diameter of 20 to 100 nm and a length of 1 to 10 microns, and had a highly straight shape. The thickness of the tube walls made of carbon was 5 to 40 nm, and the thickness was substantially uniform over the entire length of each tube. TEM observation showed that the carbon walls did not have a nested or scroll form, and instead had a patchwork-like (so-called papier-mâché like) form; and X-ray diffractometry confirmed that the carbon tubes were nanoflake carbon tubes having a graphite structure in which the mean distance between the hexagonal carbon layers (d002) was not more than 0.34 nm. Further, X-ray diffraction and EDX confirmed that the interiors of the nanoflake carbon tubes in the iron-carbon composites of the present invention were partially filled with iron carbide.

The thus-obtained carbonaceous material containing a large number of the iron-carbon composites of the present invention was observed with an electron microscope (TEM), and it was seen that in the iron-carbon composites, the filling proportions of iron carbide in the internal spaces of the nanoflake carbon tubes (i.e., the spaces defined by the walls of nanoflake carbon tubes) vary from 20 to 60%.

The mean filling proportion calculated by observing a plurality of fields of the TEM image of the iron carbide filling the internal spaces of the nanoflake carbon tubes in the numerous iron-carbon composites was 30%. The R value calculated from the X-ray diffraction was 0.57.

Reference Example 3

One gram of the iron-carbon composites obtained in Reference Example 2 (nanoflake carbon tubes partially filled with iron carbide) was dispersed in 100 ml of 1N hydrochloric acid, and the dispersion was stirred at room temperature for 6 hours, followed by filtration. The same procedure was repeated twice using 100 ml of 1N hydrochloric acid to thereby obtain empty nanoflake carbon tubes.

The obtained nanoflake carbon tubes had substantially the same form, external shape, length and wall thickness as the iron-carbon composites obtained in Reference Example 2. TEM observation showed that the carbon walls did not have a nested or scroll form, and instead had a patchwork-like (so-called papier-mâché-like) form; and X-ray diffractometry confirmed that the carbon tubes were nanoflake carbon tubes having a graphite structure in which the mean distance (d002) between the hexagonal carbon layers was not more than 0.34 nm.

Examples 1 to 5

The curable resin used was a photosensitive acrylic resin [a mixture of 98 g of an epoxy acrylate resin ("EAM-2160" manufactured by Nippon Kayaku Co., Ltd.), 1 g of a photoinitiator ("DETX-S" manufactured by Nippon Kayaku Co., Ltd.) and 1 g of a photopolymerization accelerator ("EPA" manufactured by Nippon Kayaku Co., Ltd.)].

The iron-carbon composites obtained in Reference Example 2 were used as nanoscale carbon tubes, in the amounts indicated in Table 1. In Table 1, the amounts (parts by weight) of nanoscale carbon tubes are expressed per 100 total parts by weight of the epoxy acrylate resin, photoinitiator and photopolymerization accelerator.

The resin and nanoscale carbon tubes (iron-carbon composites) were mixed in a ceramic three-roll mill ("NR-42A" manufactured by Noritake Co.) to homogeneously disperse the nanoscale carbon tubes in the resin and thereby obtain a paste.

The obtained paste was placed in a cylindrical mold and irradiated with ultraviolet rays (exposure: 6 J/cm$^2$) using a mercury lamp (500 W) to obtain a cylindrical molded article. The center portion of the molded article was bored to obtain an evaluation sample. As shown by 501 in FIG. 5, the evaluation sample was a doughnut-shaped coaxial product having an outer diameter (2b) of 0.7 cm, an inner diameter (2a) of 0.3 cm and a height (L) of 0.15 cm.

Comparative Examples 1 to 3

Comparative evaluation samples were obtained in the same manner as in Examples 1 to 5 except that the iron-carbon composites were used in amounts of 0 wt. %, 1.02 wt. % and 2.98 wt. %, based on the total weight of the epoxy acrylate resin, photoinitiator and photopolymerization accelerator.

Example 6

An evaluation sample was obtained in the same manner as in Example 2 except that the amorphous nanoscale carbon tubes obtained in Reference Example 1 were used in place of the iron-carbon composites.

Comparative Examples 4 and 5

Comparative evaluation samples were obtained in the same manner as in Example 6 except that the amorphous nanoscale carbon tubes were used in amounts of 1.19 wt. % and 3.02 wt. % based on the total weight of the epoxy acrylate resin, photoinitiator and photopolymerization accelerator.

Example 7

An evaluation sample was obtained in the same manner as in Examples 1 to 5 except that commercial single-walled carbon nanotubes were used in the amount indicated in Table 1, in place of the iron-carbon composites.

Comparative Examples 6 to 8

Comparative evaluation samples were obtained in the same manner as in Example 7 except that the single-walled carbon nanotubes were used in amounts of 0.50 wt. %, 0.98 wt. % and 3.01 wt. % based on the photosensitive acrylic resin [a mixture of 98 g of an epoxy acrylate resin ("EAM-2160" manufactured by Nippon Kayaku Co., Ltd.), 1 g of photoinitiator ("DETX-S" manufactured by Nippon Kayaku Co., Ltd.) and 1 g of photopolymerization accelerator (Nippon Kayaku Co., Ltd., EPA)].

TABLE 1

| | Total of epoxy acrylate resin, photoinitiator and photopolymerization accelerator (parts by weight) | Nanoscale carbon tubes (parts by weight) | | |
|---|---|---|---|---|
| | | Iron-carbon composites (Reference Example 2) | Amorphous nanoscale carbon tubes (Reference Example 1) | Carbon nanotubes (commercial product) |
| Comp. Ex. 1 | 100 | 0 | — | — |
| Ex. 1 | 100 | 0.005 | — | — |
| Ex. 2 | 100 | 0.01 | — | — |
| Ex. 3 | 100 | 0.03 | — | — |
| Ex. 4 | 100 | 0.05 | — | — |
| Ex. 5 | 100 | 0.10 | — | — |
| Comp. Ex. 2 | 100 | 1.02 | — | — |
| Comp. Ex. 3 | 100 | 2.98 | — | — |
| Ex. 6 | 100 | — | 0.01 | — |
| Comp. Ex. 4 | 100 | — | 1.19 | — |
| Comp. Ex. 5 | 100 | — | 3.02 | — |
| Ex. 7 | 100 | — | — | 0.02 |
| Comp. Ex. 6 | 100 | — | — | 0.50 |
| Comp. Ex. 7 | 100 | — | — | 0.98 |
| Comp. Ex. 8 | 100 | — | — | 3.01 |

Test Example 1

The tan δ and dielectric constant of the evaluation samples obtained in Examples 1 to 7 and Comparative Examples 1 to 8 in the GHz band were measured according to the method described by Satoru KUROKAWA et al. in Reports of Kyoto Prefectural Comprehensive Center for Small and Medium Enterprises, 2002, No. 30.

Figure 5:
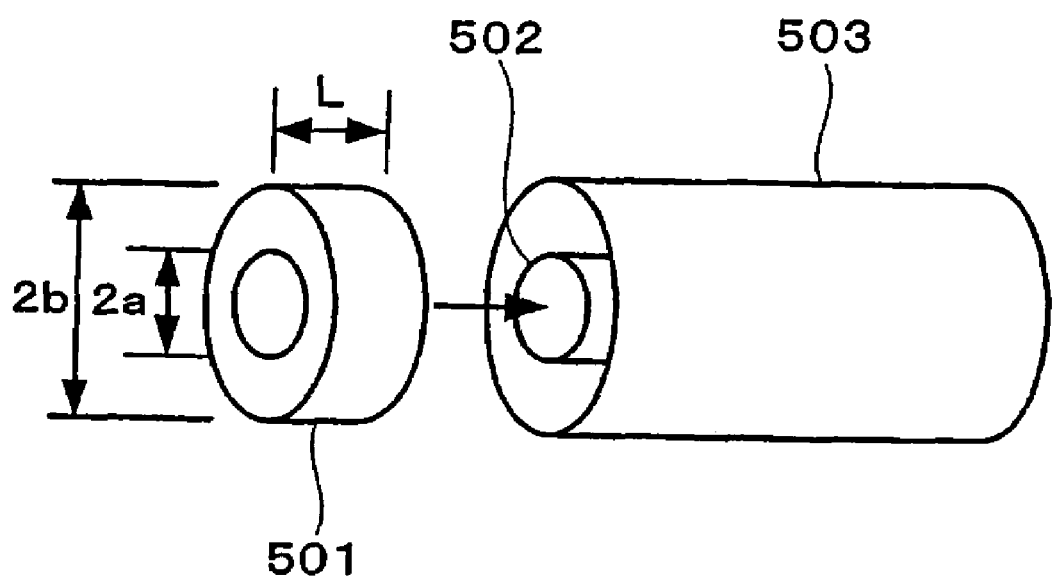
FIG. 5 is a perspective view showing the shapes of the evaluation samples produced in Examples and Comparative Examples and outer and inner conductors.

Specifically, each of the evaluation samples having a doughnut shape (outer diameter (2b): 0.7 cm, inner diameter (2a): 0.3 cm, height (L): 0.15 cm) corresponding to a coaxial connector of APC 7 mm standard specification was inserted into an outer conductor 503 as shown in FIG. 5, and two S parameters, $S_{11}$ and $S_{21}$, were measured to determine the complex dielectric constant. The measurement was carried out using a vector network analyzer, by inserting the test sample having a doughnut shape corresponding to the coaxial connector of APC 7 mm standard specification and measuring the two S parameters $S_{11}$ and $S_{21}$ to find the complex dielectric constant.

Figure 6:
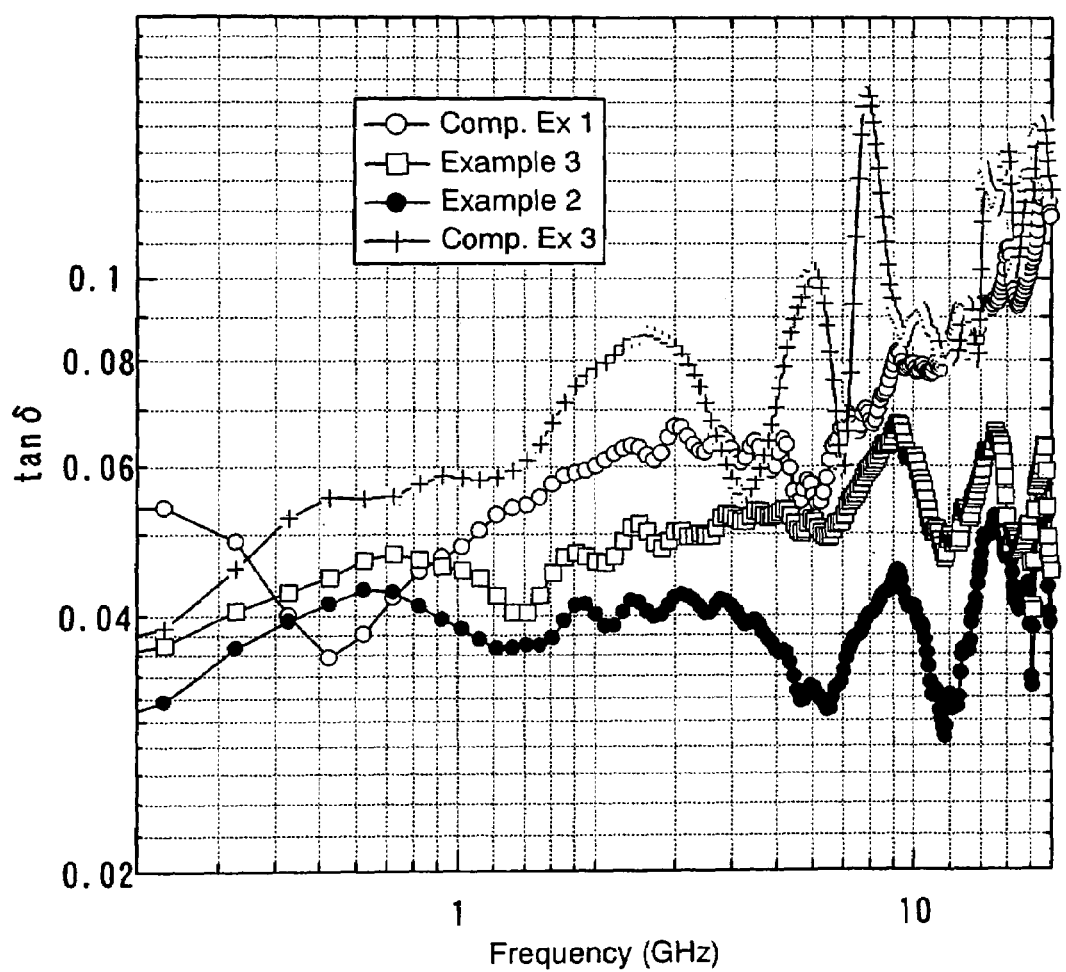
FIG. 6 is a graph showing the results of measuring the tan δ of the evaluation samples obtained in Comparative Example 1, Example 2, Example 3 and Comparative Example 3.
Figure 7:
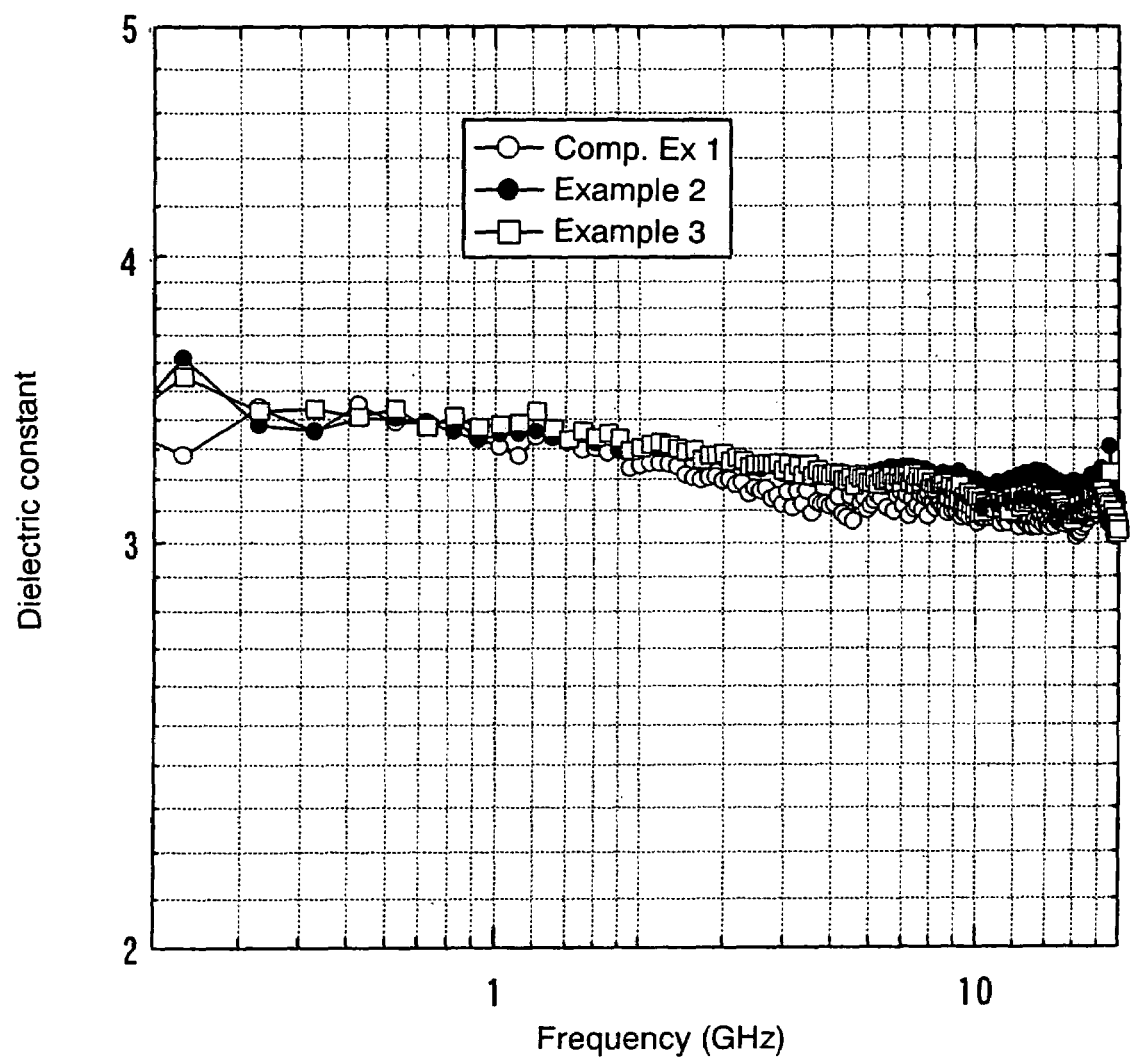
FIG. 7 is a graph showing the results of measuring the dielectric constant of the evaluation samples obtained in Comparative Example 1, Example 2 and Example 3.

FIG. 6 shows the results of measuring the tan δ of the evaluation samples obtained in Comparative Example 1, Example 2, Example 3 and Comparative Example 3. FIG. 7 shows the results of measuring the dielectric constants of the evaluation samples obtained in Comparative Example 1, Example 2 and Example 3. FIGS. 6 and 7 reveal that, in the evaluation samples obtained from resin compositions containing specific amounts of iron-carbon composites (Examples 2 and 3), an increase of dielectric loss tangent (tan δ) is suppressed but the dielectric constant is substantially the same, compared to the evaluation sample obtained from only a resin containing no iron-carbon composites (Comparative Example 1).

Figure 8:
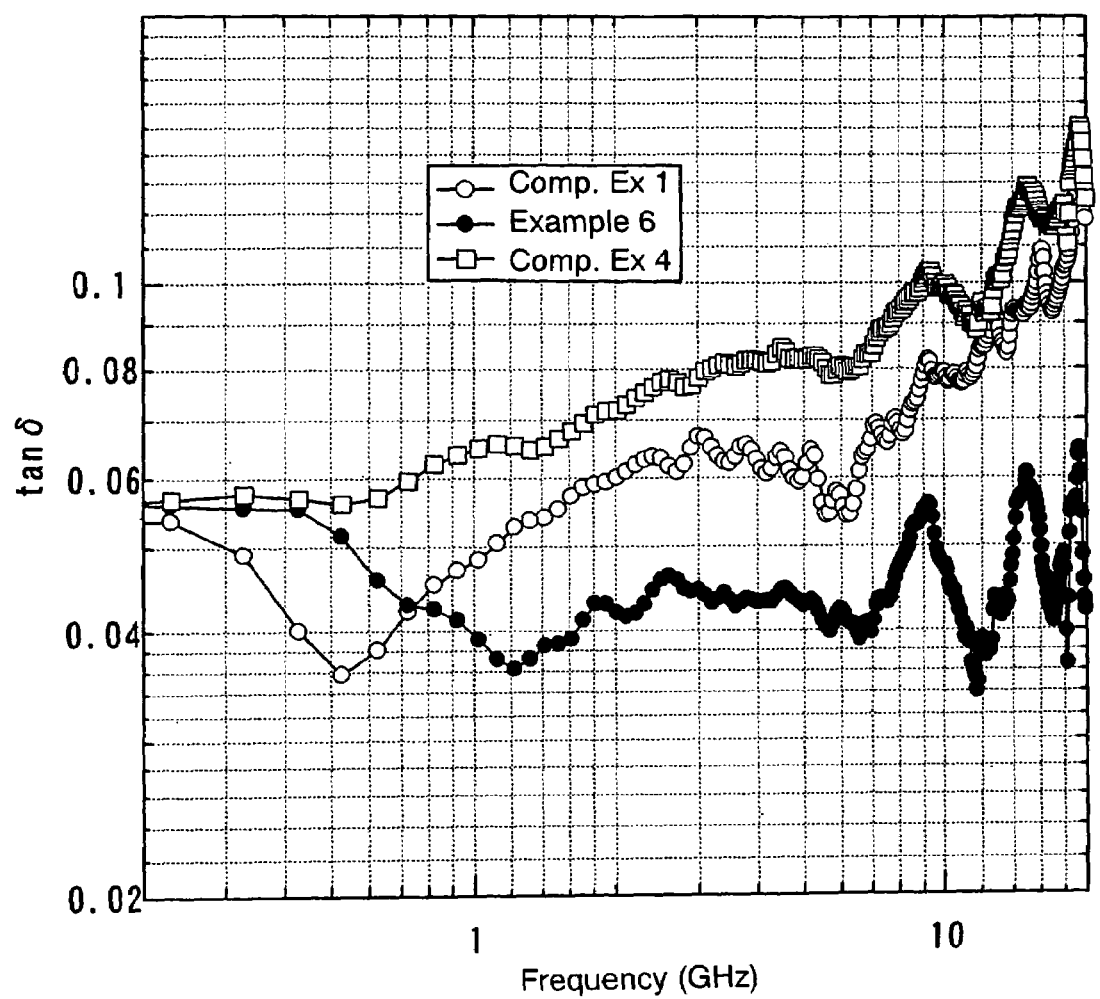
FIG. 8 is a graph showing the results of measuring the tan δ of the evaluation samples obtained in Comparative Example 1, Example 6 and Comparative Example 4.

FIG. 8 shows the results of measuring the tan δ of the evaluation samples obtained in Comparative Example 1, Example 6 and Comparative Example 4. FIG. 8 reveals that, in the evaluation sample of Example 6, which contains amorphous nanoscale carbon tubes in an amount of about 0.01 wt. %, increase of tan δ is suppressed, compared to the evaluation sample consisting of a resin alone (Comparative Example 4) and the evaluation sample containing the amorphous nanoscale carbon tubes in an amount of more than 1 wt. % (Comparative Example 4).

Figure 9:
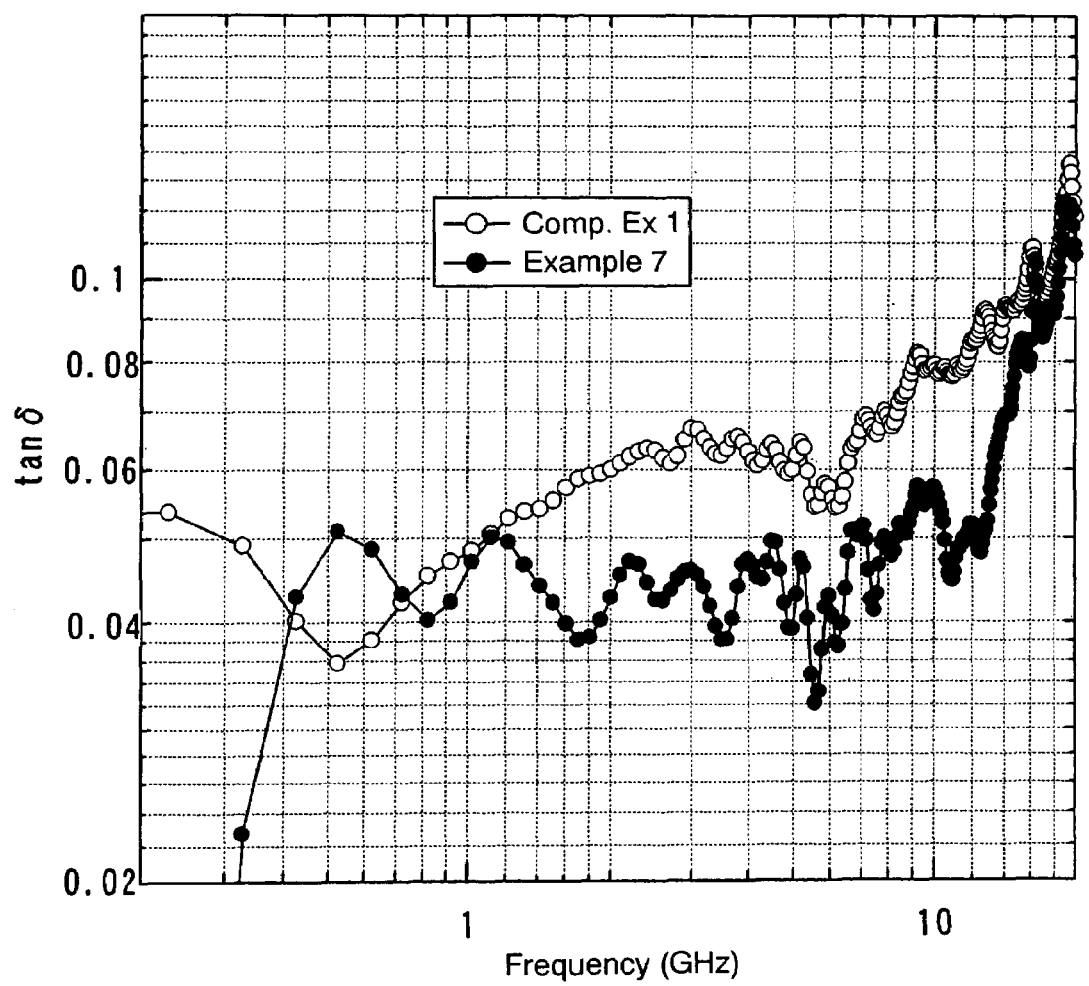
FIG. 9 is a graph showing the results of measuring the tan δ of the evaluation samples obtained in Comparative Example 1 and Example 7.

FIG. 9 shows the results of measuring the tan δ of the evaluation samples obtained in Comparative Example 1 and Example 7. FIG. 9 reveals that, in the evaluation sample of Example 7, which contains carbon nanotubes in an amount of about 0.02 wt. %, increase of tan δ is suppressed, compared to the evaluation sample consisting of a resin alone (Comparative Example 1).

Table 2 shows the results of measuring the tan δ and dielectric constant at 1 GHz, 5 GHz and 10 GHz of the evaluation samples obtained in the Examples and Comparative Examples.

TABLE 2

| | Tan δ | | | Dielectric constant | | |
|---|---|---|---|---|---|---|
| | 1 GHz | 5 GHz | 10 GHz | 1 GHz | 5 GHz | 10 GHz |
| Comp. Ex. 1 | 0.05 | 0.06 | 0.08 | 3.3 | 3.1 | 3.1 |
| Ex. 1 | 0.04 | 0.04 | 0.04 | 3.3 | 3.2 | 3.1 |
| Ex. 2 | 0.04 | 0.04 | 0.04 | 3.4 | 3.2 | 3.2 |
| Ex. 3 | 0.05 | 0.05 | 0.06 | 3.4 | 3.2 | 3.2 |
| Ex. 4 | 0.04 | 0.04 | 0.05 | 3.4 | 3.2 | 3.2 |
| Ex. 5 | 0.05 | 0.05 | 0.07 | 3.4 | 3.3 | 3.2 |
| Comp. Ex. 2 | 0.08 | 0.07 | 0.09 | 3.5 | 3.3 | 3.3 |
| Comp. Ex. 3 | 0.06 | 0.07 | 0.09 | 4.1 | 4.0 | 3.9 |
| Ex. 6 | 0.04 | 0.04 | 0.04 | 3.2 | 3.2 | 3.2 |
| Comp. Ex. 4 | 0.06 | 0.08 | 0.10 | 4.9 | 4.4 | 4.3 |
| Comp. Ex. 5 | 0.06 | 0.11 | 0.15 | 8.3 | 7.8 | 7.3 |
| Ex. 7 | 0.05 | 0.04 | 0.06 | 3.3 | 3.2 | 3.2 |
| Comp. Ex. 6 | 0.22 | 0.18 | 0.17 | 5.6 | 4.6 | 4.2 |
| Comp. Ex. 7 | 0.25 | 0.23 | 0.26 | 7.9 | 6.1 | 5.8 |
| Comp. Ex. 8 | 0.21 | 0.23 | 0.26 | 10.7 | 9.0 | 8.2 |

It is evident from Table 2 that, in the electronic components obtained using the resin compositions according to the present invention, which contain specific amounts of nanoscale carbon tubes, an increase of tan δ is suppressed while intrinsic properties (dielectric constant) of the resins are maintained without deterioration in the GHz band, and especially in the frequency range from 1 to 10 GHz, compared to the evaluation sample obtained from a resin per se containing no iron-carbon composites (Comparative Example 1).

Test Example 2

With respect to molded articles obtained in the same manner as in Comparative Examples 1 and 2 and Examples 1 to 5 (tensile test pieces), tensile strength was measured according to JIS K6911, breaking elongation was measured according to JIS C2151 and pencil hardness was measured according to JIS K5600.

The tensile test pieces used for measuring these properties were prepared according to the respective JIS specifications.

Table 3 shows the results. As is clear from Table 3, compared to the properties of the molded article of Comparative Example 1 containing no nanoscale carbon tubes (intrinsic properties of the resin), the properties of the molded article of Comparative Example 2, which contains nanoscale carbon tubes in an amount exceeding the range specified in the present invention, significantly change, whereas the properties of the molded articles of Examples 1 to 5, which contain nanoscale carbon tubes in an amount within the range specified in the present invention, do not significantly change.

TABLE 3

| | Tensile strength (*1) (MPa) | Breaking elongation (*2) (%) | Pencil hardness (*3) |
|---|---|---|---|
| Comp. Ex. 1 | 45 | 2.5 | 5H |
| Ex. 1 | 47 | 2.3 | 5H |
| Ex. 2 | 50 | 2.4 | 5H |
| Ex. 3 | 46 | 2.5 | 5H |
| Ex. 4 | 50 | 2.2 | 5H |
| Ex. 5 | 52 | 2.0 | 5H |
| Comp. Ex. 2 | 55 | 1.9 | 6H |

Note:
Test methods
(*1): JIS K6911
(*2): JIS C2151
(*3): JIS K5600

Examples 8 to 11

The resin used was a photosensitive acrylic resin [a mixture of 98 g of an epoxy acrylate resin ("EAM-2160" manufactured by Nippon Kayaku Co., Ltd.), 1 g of a photoinitiator ("DETX-S" manufactured by Nippon Kayaku Co., Ltd.) and 1 g of a photopolymerization accelerator ("EPA" manufactured by Nippon Kayaku Co., Ltd.)].

The iron-carbon composites obtained in Reference Example 2 were used as nanoscale carbon tubes, in the amount indicated in Table 4. In Table 4, the amounts (parts by weight) of nanoscale carbon tubes are expressed per 100 parts by weight of the photosensitive acrylic resin (the total of the epoxy acrylate resin, photoinitiator and photopolymerization accelerator).

First, the resin and nanoscale carbon tubes (iron-carbon composites) were mixed in a ceramic three-roll mill ("NR-42A" manufactured by Noritake Co.) to homogeneously disperse the nanoscale carbon tubes in the resin, giving a paste of Example 8.

The paste of Example 8 was then diluted with the paste of Comparative Example 1 (comprising an epoxy acrylate resin, photoinitiator and photopolymerization accelerator) so that the proportions of the ingredients became as shown in Table 4, to thereby obtain pastes of Examples 9 to 11 having lower nanoscale carbon tube concentrations than the paste of Example 8.

Each obtained paste was placed in a cylindrical mold and irradiated with ultraviolet rays (exposure: 6 J/cm$^2$) using a mercury lamp (500 W) to obtain a cylindrical molded article. The center portion of the molded article was bored to obtain an evaluation sample. The evaluation sample was a doughnut-shaped coaxial product having an outer diameter of 0.7 cm, an inner diameter of 0.3 cm and a height of 0.3 cm.

Test Example 3

The tan δ of the evaluation samples obtained in Examples 8 to 11 in the GHz band was measured in the same manner as in Test Example 1.

Figure 10:
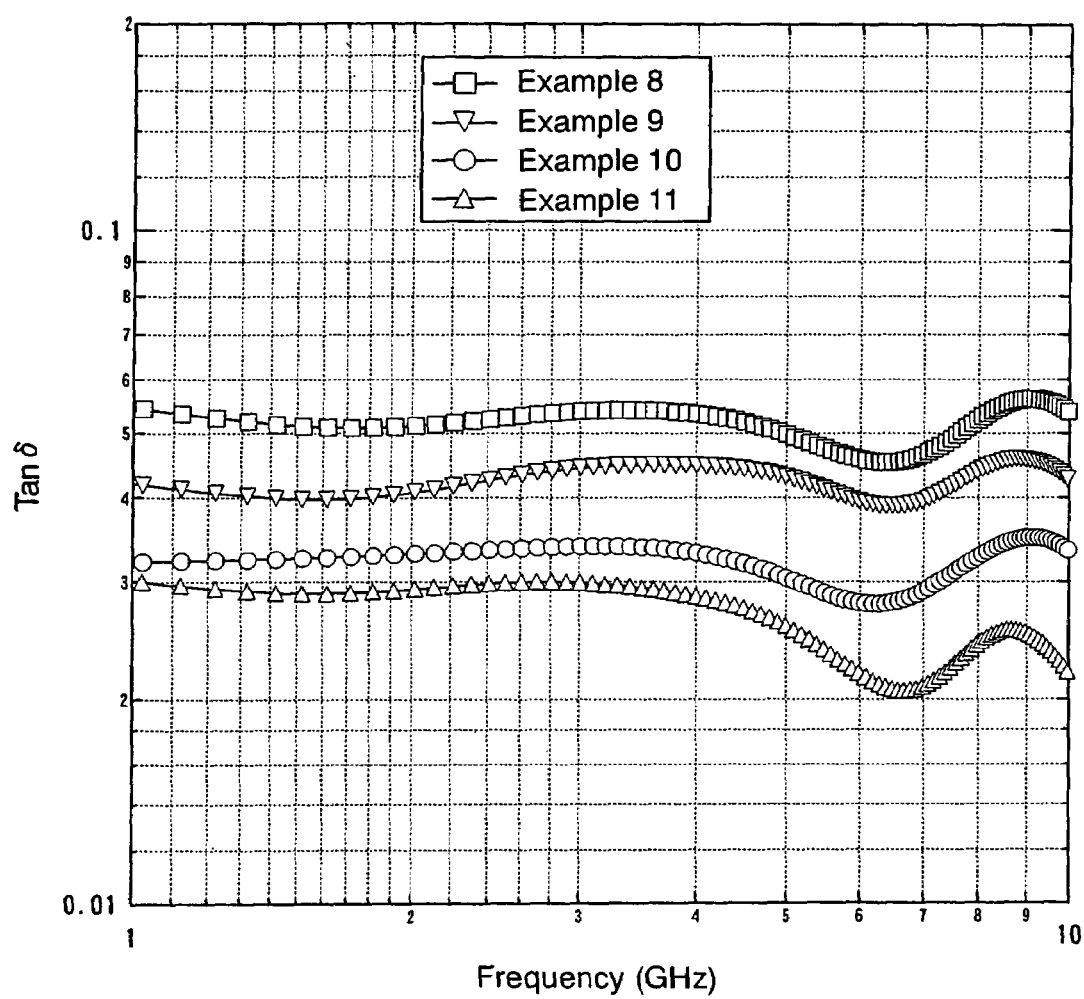
FIG. 10 is a graph showing the results of measuring the tan δ of the evaluation samples obtained in Examples 8 to 11.

FIG. 10 shows the results of measuring tan δ of the evaluation samples obtained in Examples-8 to 11.

As is clear from FIG. 10, increase of dielectric loss tangent (tan δ) of the evaluation samples obtained from resin compositions containing specific amounts of iron-carbon composites is suppressed, compared to that of the evaluation sample obtained from only a resin without using iron-carbon composites (Comparative Example 1).

Table 4 shows the results of measuring tan δ of the evaluation samples of Examples 8 to 11 at 1 GHz, 5GHz and 10 GHz.

TABLE 4

| Example | Total of epoxy acrylate resin, photoinitiator and photopolymerization accelerator (parts by weight) | Iron-carbon composites (Ref. Ex. 2) (parts by weight) | Tanδ 1 GHz | 5 GHz | 10 GHz |
|---|---|---|---|---|---|
| 8 | 100 | 0.038 | 0.055 | 0.050 | 0.055 |
| 9 | 100 | 0.019 | 0.042 | 0.043 | 0.043 |
| 10 | 100 | 0.008 | 0.033 | 0.030 | 0.033 |
| 11 | 100 | 0.0007 | 0.030 | 0.026 | 0.022 |

Example 12

An evaluation sample was obtained in the same manner as in Example 6 except for using nanoflake carbon tubes obtained in Reference Example 3 in place of the amorphous nanoscale carbon tubes.

The tan δ and dielectric constant of the obtained evaluation sample were measured in the same manner as in Test Example 1, and found to be substantially the same as those of the evaluation sample obtained in Example 6.

Examples 13 to 17

The resin used was a thermosetting epoxy resin obtained by mixing 98 g of brominated bisphenol A-type epoxy resin ("5046B80" manufactured by Japan Epoxy Resins Co., Ltd.) and 2 g of curing agent (dicyandiamide: "DICY7" manufactured by Japan Epoxy Resins Co., Ltd.).

The iron-carbon composites obtained in Reference Example 2 were used as nanoscale carbon tubes, in the amounts indicated in Table 5.

In Table 5, the amounts (parts by weight) of the nanoscale carbon tubes are expressed per 100 parts by weight of the thermosetting epoxy resin.

The resin and nanoscale carbon tubes (iron-carbon composites) were mixed in a ceramic three-roll mill ("NR-42A" manufactured by Noritake Co.) to homogeneously disperse the nanoscale carbon tubes in the resin, giving a paste.

The obtained paste was placed in a cylindrical mold and thermally cured at 220° C. for 30 minutes to obtain a cylindrical molded article. The center portion of the molded article was bored to obtain an evaluation sample. The evaluation sample was a doughnut-shaped coaxial product as shown in 501 in FIG. 5, and had an outer diameter (2b) of 0.7 cm, an inner diameter (2a) of 0.3 cm and a height (L) of 0.15 cm.

Comparative Examples 9 to 11

Comparative evaluation samples were obtained in the same manner as in Examples 13 to 17 except that the iron-carbon composites were used in amounts of 0 wt. %, 1.05 wt. % and 3.02 wt. % based on the thermosetting epoxy resin.

Examples 18 and 19

Evaluation samples were obtained in the same manner as in Examples 13 to 17 except that the amorphous nanoscale carbon tubes obtained in Reference Example 1 were used in place of the iron-carbon composites, in the amounts indicated in Table 5.

Comparative Example 12

A comparative evaluation sample was obtained in the same manner as in Example 18 except that the amorphous nanoscale carbon tubes were used in an amount of 3.02 wt. % based on the thermosetting epoxy resin.

Test Example 4

The tan δ of the evaluation samples of Examples 13 to 19 and Comparative Examples 9 to 12 in the GHz band was measured in the same manner as in Test Example 1. Table 5 shows the results.

TABLE 5

| | Thermosetting epoxy resin (parts by weight) | Iron-carbon composites (Ref. Ex. 2) | Amorphous nanoscale carbon tubes (Ref. Ex. 1) | Tanδ 1 GHz | 5 GHz | 10 GHz |
|---|---|---|---|---|---|---|
| Comp. Ex. 9 | 100 | 0 | — | 0.020 | 0.029 | 0.042 |
| Ex. 13 | 100 | 0.0005 | — | 0.015 | 0.016 | 0.021 |
| Ex. 14 | 100 | 0.005 | — | 0.017 | 0.023 | 0.026 |
| Ex. 15 | 100 | 0.01 | — | 0.017 | 0.020 | 0.031 |
| Ex. 16 | 100 | 0.05 | — | 0.021 | 0.026 | 0.034 |
| Ex. 17 | 100 | 0.10 | — | 0.022 | 0.029 | 0.039 |
| Comp. Ex. 10 | 100 | 1.05 | — | 0.031 | 0.044 | 0.056 |
| Comp. Ex. 11 | 100 | 3.02 | — | 0.039 | 0.068 | 0.095 |
| Ex. 18 | 100 | — | 0.001 | 0.016 | 0.022 | 0.025 |
| Ex. 19 | 100 | — | 0.01 | 0.020 | 0.025 | 0.033 |
| Comp. Ex. 12 | 100 | — | 3.02 | 0.06 | 0.10 | 0.11 |

As is evident from Table 5, increase of dielectric loss tangent (tan δ) of the evaluation samples according to the present invention obtained from resin compositions containing specific amounts of iron-carbon composites is suppressed, compared to the evaluation sample obtained from a resin containing no iron-carbon composites (Comparative Example 9).

Examples 20 to 23

Nanoscale carbon tubes, which were the amorphous nanoscale carbon tubes obtained in Reference Example 1 or the iron-carbon composites obtained in Reference Example 2, were added to a high-pressure-processed low density polyethylene (LDPE) (Japan Polychem Corp.), in an amount of 1 wt. % based on the LDPE, followed by heating and kneading in a double-arm pressure kneader (Moriyama Seisakusho).

Further, LDPE was added to the kneaded mixtures containing 1 wt. % of nanoscale carbon tubes so that the nanoscale carbon tube contents became as shown in Table 6. The resulting mixtures were heated and kneaded in the double-arm pressure kneader and molded using an injection molding machine (Nissei Plastic Industrial Co., Ltd.) to obtain rod-shaped evaluation test pieces with a diameter of 3 mm and a length of 120 mm.

The dielectric loss tangent of the obtained evaluation test pieces at 2 GHz was measured by Perturbation Closed Cavity Method described in the literature (Mitsubishi Cable Industries Review, April 2003, "Development of Low-Loss Materials for High-Frequency Coaxial Cables Used Under High Frequency Bands—Evaluation of Dielectric Characteristics by Cavity Resonator Perturbation Method at Ultra-High-Frequency Band (GHz Band)").

Table 6 shows the results. In Table 6, the amounts (parts by weight) of the nanoscale carbon tubes are expressed per 100 parts by weight of the thermoplastic epoxy resin.

Comparative Example 13

A comparative rod-shaped evaluation test piece was obtained in the same manner as in Examples 20 to 23 except that nonoscale carbon tubes were not used, and the dielectric loss tangent thereof was measured. Table 6 shows the results.

TABLE 6

|  | Thermoplastic resin (polyethylene resin) (parts by weight) | Nanoscale carbon tubes (parts by weight) | | Tanδ 2 GHz |
|---|---|---|---|---|
|  |  | Iron-carbon composites (Ref. Ex. 2) | Amorphous nanoscale carbon tubes (Ref. Ex. 1) |  |
| Comp. Ex. 13 | 100 | 0 | — | 0.0010 |
| Ex. 20 | 100 | 0.0005 | — | 0.0005 |
| Ex. 21 | 100 | 0.005 | — | 0.0006 |
| Ex. 22 | 100 | 0.01 | — | 0.0008 |
| Ex. 23 | 100 | — | 0.001 | 0.0006 |

As is evident from Table 6, the rod-shaped evaluation test pieces according to the present invention obtained from resin compositions containing specific amounts of nanoscale carbon tubes (Examples 20 to 23) have reduced tan δ at 2 GHz, compared to a rod-shaped evaluation test sample obtained from a resin containing no nanoscale carbon tubes (Comparative Example 13).

INDUSTRIAL APPLICABILITY

In the electronic component of the present invention obtained from a resin composition prepared by adding the above-mentioned naoscale carbon tubes to a resin in an extremely small amount of 0.0001 to 0.4 wt. %, the dielectric loss tangent (tan δ) in the GHz band is reduced, compared to electronic components obtained from only resins, or the increase of tan δ, which occurs when using only resins, can be suppressed; and drifting of tan δ caused by GHz frequencies can also be suppressed; while properties intrinsic to resins, such as the dielectric constant, heat resistance, mechanical strength (e.g., tensile strength, breaking elongation, hardness, etc.) and chemical properties, and in particular dielectric properties, remain substantially unchanged.

Therefore, use of such a resin composition makes it possible to provide an electronic component that can be advantageously used as a circuit board material for electrical and electronic devices, in particular as a circuit board material for GHz-band devices, and the like.

The invention claimed is:

1. A resin composition for GHz-band electronic components, the composition comprising nanoscale carbon tubes and at least one resin selected from the group consisting of thermoplastic resins, curable resins, and composite resins of thermoplastic resins and curable resins, wherein the nanoscale carbon tubes are present in an amount of 0.0001 to 0.4 wt. % based on the resin, wherein the nanoscale carbon tubes are:
(ii) amorphous nanoscale carbon tubes;
(iii) nanoflake carbon tubes;
(iv) iron-carbon composites each composed of (a) a carbon tube selected from the group consisting of nanoflake carbon tubes and nested multi-walled carbon nanotubes, and (b) iron carbide or iron, wherein the iron carbide or iron (b) fills 10 to 90% of the internal space of the carbon tube (a); or
(v) a mixture of at least two of (ii) to (iv).

2. A resin composition for GHz-band electronic components according to claim 1, wherein the nanoscale carbon tubes are amorphous nanoscale carbon tubes having an interlayer spacing between hexagonal carbon layers (002) of not less than 3.54 Å, an angle of diffraction (2θ) of not more than 25.1 degrees, and a 2θθ band half-width of not less than 3.2 degrees, as determined by X-ray diffractometry (incident X-ray: CuKα).

3. A resin composition for GHz-band electronic components according to claim 1, wherein the resin is at least one thermoplastic resin selected from the group consisting of polyolefin resins, polyester resins, polyamide resins, fluororesins, polystyrene resins, polyvinyl chloride resins, methacrylic ester resins, acrylic ester resins, polycarbonate resins, polysulfone resins, polyethersulfone resins, polyphenylene sulfide resins, polyphenylene ether resins, ABS resins, polyetheretherketone resins, liquid crystal polymers, thermoplastic polyimide resins, polyetherimide resins, polyacetals, polyarylates and polyethemitrile resins.

4. A resin composition for GHz-band electronic components according to claim 1, wherein the resin is at least one curable resin selected from the group consisting of thermosetting resins, photocurable resins and electron-beam-curable resins.

5. A resin composition for GHz-band electronic components according to claim 1, wherein the resin is at least one composite resin selected from the group consisting of thermoplastic resins having dispersed therein cured product of curable resins, and curable resins having dispersed therein a thermoplastic resin.

6. A resin composition for GHz-band electronic components according to claim 1, wherein the amount of the nanoscale carbon tubes is 0.001 to 0.4 wt. % based on the resin.

7. A resin composition for GHz-band electronic components according to claim 1, wherein the nanoscale carbon tubes are amorphous nanoscale carbon tubes, and wherein the amount of the nanoscale carbon tubes is 0.0001 to 0.1 wt. % based on the resin.

8. A resin composition for GHz-band electronic components according to claim 1, wherein the nanoscale carbon tubes are iron-carbon composites, and wherein the amount of the nanoscale carbon tubes is 0.0001 to 0.4 wt. % based on the resin.

9. A resin composition for GHz-band electronic components according to claim 1, wherein the nanoscale carbon tubes are nanoflake carbon tubes, and wherein the amount of the nanoscale carbon tubes is 0.0001 to 0.1 wt. % based on the resin.

10. A GHz-band electronic component obtainable from a resin composition according to claim 1.

11. A GHz-band electronic component according to claim 10, which is a circuit board, an interlayer dielectric, an antenna component, or an insulation material for high frequency coaxial cables.

12. A GHz-band electronic component according to claim 10, wherein tan δ of the resin is reduced to 0.1 or lower in the GHz band while other intrinsic properties of the resin are retained.

13. A method for reducing, or suppressing an increase of, tan δ of an electronic component in the GHz band, the electronic component being obtained from at least one resin selected from the group consisting of thermoplastic resins, curable resins, and composite resins of thermoplastic resins and curable resins;

the method comprising adding nanoscale carbon tubes to the resin in an amount of 0.0001 to 0.4 wt. % based on the resin, wherein the nanoscale carbon tubes are:

(ii) amorphous nanoscale carbon tubes;

(iii) nanoflake carbon tubes;

(iv) iron-carbon composites each composed of (a) a carbon tube selected from the group consisting of nanoflake carbon tubes and nested multi-walled carbon nanotubes, and (b) iron carbide or iron, wherein the iron carbide or iron (b) fills 10 to 90% of the internal space of the carbon tube (a); or (v) a mixture of at least two of (ii) to (iv).

14. A method for reducing, or suppressing an increase of, tan δ, in the GHz band, of an electronic component obtained from at least one resin selected from the group consisting of thermoplastic resins, curable resins, and composite resins of thermoplastic resins and curable resins, compared to tan δ of an electronic component obtained from the resin alone, while maintaining other intrinsic properties of the resin;

the method comprising adding nanosale carbon tubes to the resin amount of 0.0001 to 0.4 wt. % based on the resins, wherein the nanoscale carbon tubes are:

(ii) amorphous nanoscale carbon tubes;

(iii) nanoflake carbon tubes;

(iv) iron-carbon composites each composed of (a) a carbon tube selected from the group consisting of nanoflake carbon tubes and nested multi-walled carbon nanotubes, and (b) iron carbide or iron, wherein the iron carbide or iron (b) fills 10 to 90% of the internal space of the carbon tube (a); or (v) a mixture of at least two of (ii) to (iv).

* * * * *